(12) United States Patent
Okuda et al.

(10) Patent No.: US 7,521,676 B2
(45) Date of Patent: Apr. 21, 2009

(54) METHOD AND APPARATUS FOR INSPECTING PATTERN DEFECTS AND MIRROR ELECTRON PROJECTION TYPE OR MULTI-BEAM SCANNING TYPE ELECTRON BEAM APPARATUS

(75) Inventors: Hirohito Okuda, Hamden, CT (US); Takashi Hiroi, Yokohama (JP); Masaki Hasegawa, Sayama (JP); Shigeya Tanaka, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 322 days.

(21) Appl. No.: 11/601,723

(22) Filed: Nov. 20, 2006

(65) Prior Publication Data

US 2007/0194229 A1 Aug. 23, 2007

(30) Foreign Application Priority Data

Dec. 7, 2005 (JP) ............................. 2005-353351

(51) Int. Cl.
*G01N 23/225* (2006.01)
(52) U.S. Cl. .................. 250/310; 250/306; 250/307; 250/309
(58) Field of Classification Search ............... 250/306, 250/307, 309, 310, 311
See application file for complete search history.

(56) References Cited

U.S. PATENT DOCUMENTS

2003/0127593 A1* 7/2003 Shinada et al. .............. 250/310
2005/0139772 A1* 6/2005 Hasegawa et al. ........... 250/311

FOREIGN PATENT DOCUMENTS

JP 2003-202217 7/2003
JP 2004-363085 12/2004

OTHER PUBLICATIONS

Hasegawa et al.: Development of EB wafer Inspection Technique by Using Mirror Electron Projection, LSI Testing Symposium, pp. 89-93, 2004.
Murakami et al.: Development of an Electron beam Inspection System based on projection Imaging Microscopy, LSI Testing Symposium, pp. 85-87, 2004.
Nagahama et al.: Inspection performance of the electron beam inspection system based on projection electron microscopy, pp. 921-928, SPIE vol. 5375, 2004.
Satake et al.: Electron beam inspection system for semiconductor wafer, based on projection electron microscopy, pp. 1125-1134, SPIE vol. 5375, 2004.

* cited by examiner

*Primary Examiner*—Jack I Berman
*Assistant Examiner*—Michael Maskell
(74) *Attorney, Agent, or Firm*—Antonelli, Terry, Stout & Kraus, LLP.

(57) ABSTRACT

The present invention provides a mirror electron projection (MPJ) type (SEPJ type included) scanning electron beam apparatus that is capable of performing condition setup, and a method and apparatus for inspecting pattern defects with the scanning electron beam apparatus. A mirror electron projection type defect inspection apparatus, which comprises a charging device for emitting a charging electron beam, electron beam irradiation means for shedding a mirror electron projection electron beam onto an inspection region near which an electrical potential distribution is formed, detection means for detecting secondary electrons or reflected electrons generated from a surface and proximity of the specimen, and defect detection means for detecting a defect by processing a mirror image signal that is detected by the detection means, includes irradiation condition optimization means for optimizing charging electron beam irradiation conditions.

19 Claims, 17 Drawing Sheets

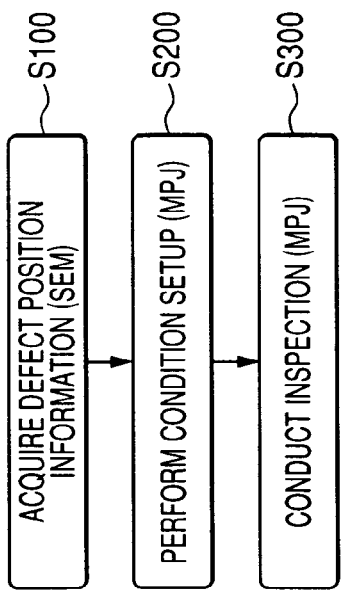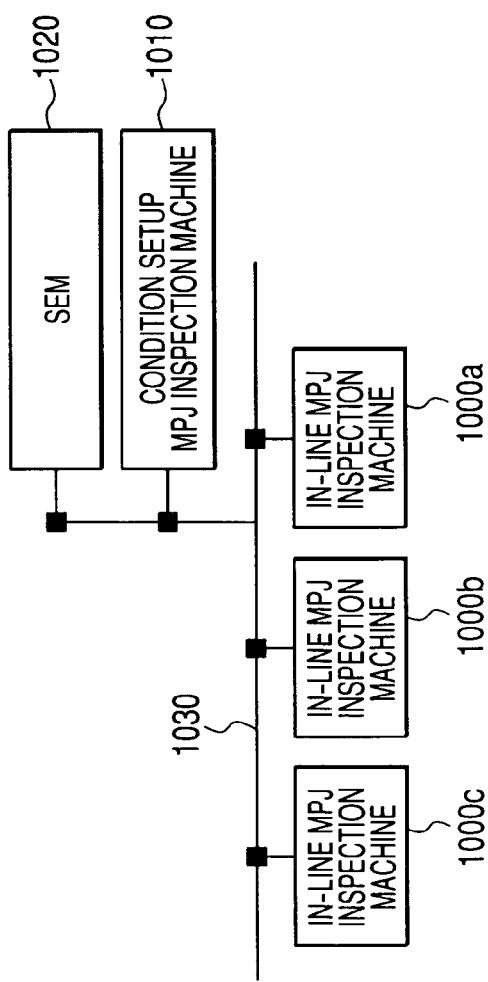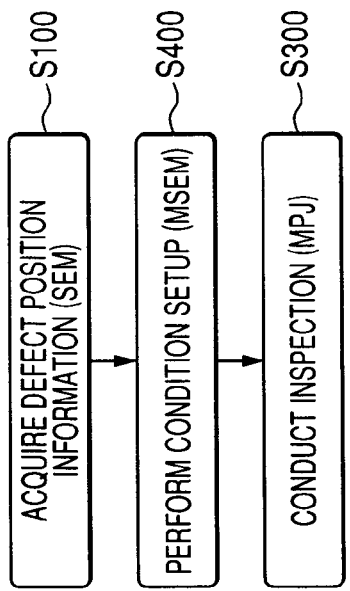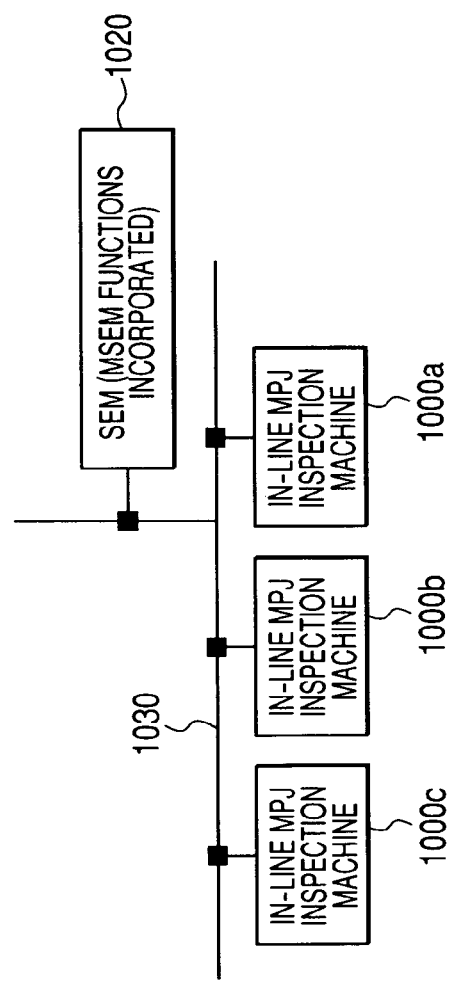

$$\text{SECONDARY ELECTRON EMISSION EFFICIENCY} = \frac{\text{NUMBER OF SECONDARY ELECTRONS}}{\text{NUMBER OF INCIDENT ELECTRONS}}$$

ELECTRON INCIDENT ENERGY (e)

ENERGY
- $e < e1$, $e2 < e$ → NEGATIVE CHARGING
- $e1 < e < e2$ → POSITIVE CHARGING

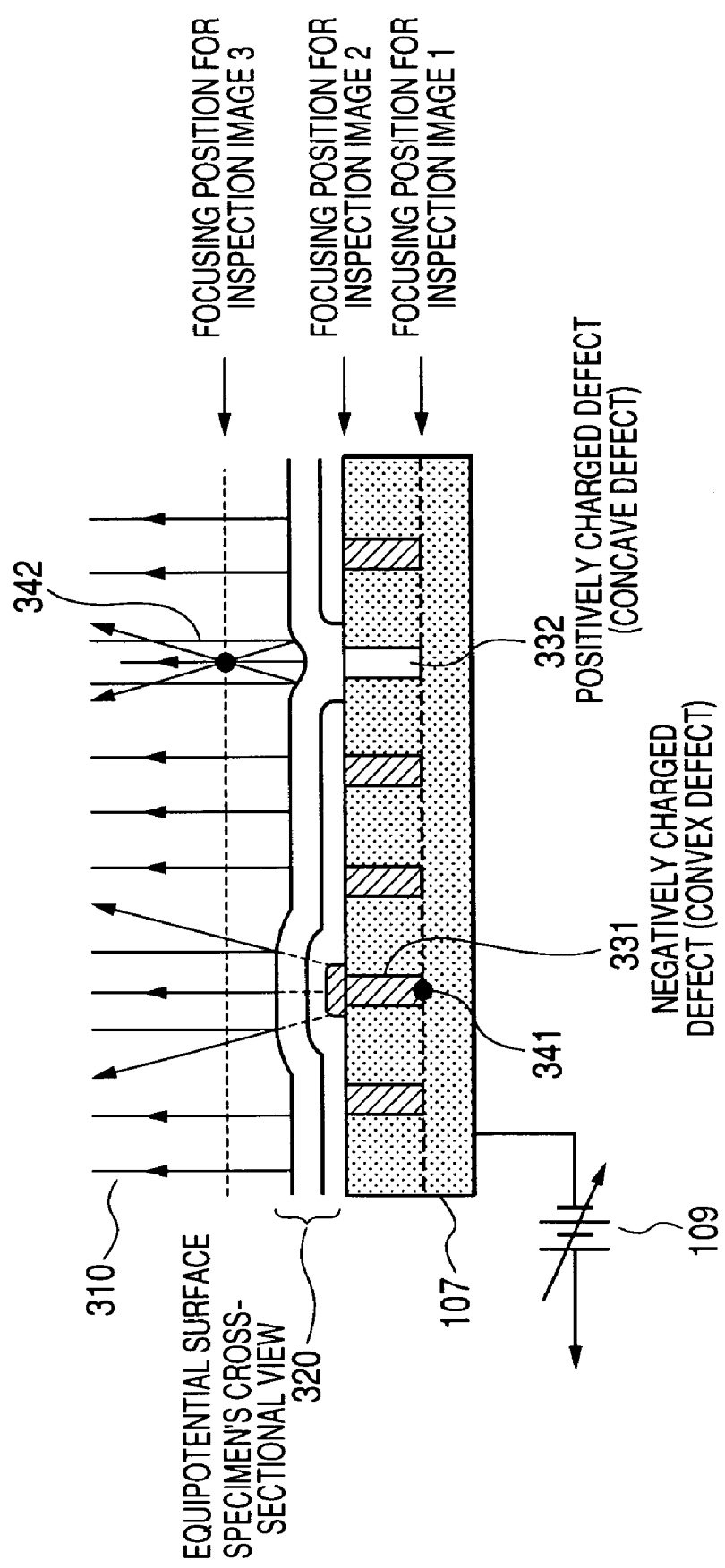

WHILE INSPECTION IS IN PROGRESS,
(A) IS REPEATED

US 7,521,676 B2

METHOD AND APPARATUS FOR INSPECTING PATTERN DEFECTS AND MIRROR ELECTRON PROJECTION TYPE OR MULTI-BEAM SCANNING TYPE ELECTRON BEAM APPARATUS

BACKGROUND OF THE INVENTION

The present invention relates to a mirror electron projection (MPJ) type (secondary electron projection (SEPJ) type included) or multi-beam scanning type electron beam apparatus, which irradiates an inspection target with a planar electron beam to detect mirror electrons, and to a method and apparatus for inspecting pattern defects with the electron beam apparatus.

A mirror electron projection type semiconductor wafer scanning electron beam apparatus, which emits a planar electron beam for throughput enhancement, is disclosed, as a replacement for a scanning type that emits a point electron beam, by Japanese Patent Laid-Open No. 202217/2003, "Hasegawa et al., Development of EB wafer inspection technique by using mirror electron projection, LSI Testing Symposium, 2004," "Murakami et al., Development of an electron beam inspection system based on projection imaging microscopy, LSI Testing Symposium, pp. 85-87, 2004," "Nagahama et al., Inspection performances of the electron beam inspection system based on projection electron microscopy, pp. 921-928, SPIE Vol. 5375, 2004," "Satake et al., Electron beam inspection system for semiconductor wafer based on projection electron microscopy, pp. 1125-1134, SPIE Vol. 5375, 2004," and Japanese Patent Laid-Open No. 363085/2004.

Japanese Patent Laid-Open No. 202217/2003 describes a defect inspection apparatus that forms an electric field on the surface of an inspection target for electron beam speed reduction purposes, causes a planar electron beam having a predetermined area, which includes an energy component that cannot reach the surface of the inspection target due to the speed reduction electric field, to reflect from a place close to the surface of the inspection target, uses an image formation lens to form an image, acquires the images of a plurality of regions on the surface of the inspection target, stores the acquired images in an image storage section, and compares the stored images of the plurality of regions to check for and locate defects in the regions.

Japanese Patent Laid-Open No. 363085/2004 describes an inspection apparatus that includes electron irradiation means for generating electrons, forming an image at a predetermined magnification to produce a crossover, and irradiating a substrate by using a desired cross-section shape; means for relatively moving a charged particle irradiation region on the substrate by moving at least either electrons emitted to the substrate or a stage that retains the substrate; a detector for detecting electrons that have acquired the surface information about the substrate; means for acquiring a detected image of an inspection target die in accordance with the information about the substrate surface that is detected by the detector; means for acquiring a reference die image, which serves as a comparison standard for a detected image of the inspection target die; and comparison means for comparing the image of the inspection target die against the reference die image.

SUMMARY OF THE INVENTION

However, a condition setup technology for a mirror electron projection (MPJ) type scanning electron beam inspection technology, which emits a planar electron beam to detect mirror electrons, is not adequately considered by Japanese Patent Laid-Open No. 202217/2003, Japanese Patent Laid-Open No. 363085/2004, "Hasegawa et al., Development of EB wafer inspection technique by using mirror electron projection LSI Testing Symposium, 2004," "Murakami et al., Development of an electron beam inspection system based on projection imaging microscopy, LSI Testing Symposium, pp. 85-87, 2004," "Nagahama et al., Inspection performances of the electron beam inspection system based on projection electron microscopy, pp. 921-928, SPIE Vol. 5375, 2004," or "Satake et al., Electron beam inspection system for semiconductor wafer based on projection electron microscopy, pp. 1125-1134, SPIE Vol. 5375, 2004."

The present invention provides a mirror electron projection (MPJ) type (SEPJ type included) or multi-beam scanning type electron beam apparatus that is capable of performing condition setup, and a method and apparatus for inspecting pattern defects with the scanning electron beam apparatus.

More specifically, the present invention provides a method and apparatus for inspecting pattern defects. The method includes a condition setup process and a defect inspection process. The condition setup process uses a condition setup scanning electron beam apparatus to determine precharge conditions, which are at least irradiation conditions for a charged electron beam, in relation to a defect inspection specimen on which a circuit pattern for a mirror electron projection type or multi-beam scanning type defect inspection scanning electron beam apparatus is formed. The defect inspection process includes a charging step, a detection step, and a defect detection step. The charging step uses the mirror electron projection type or multi-beam scanning type defect inspection scanning electron beam apparatus to irradiate an inspection region on the defect inspection specimen with a charging electron beam under the precharge conditions determined in the condition setup process, charge the inspection region, and form an electrical potential distribution near the inspection region. The detection step sheds a mirror electron projection or multiple electron beam onto the inspection region on which the electrical potential distribution is formed in the charging step to let a detector detect secondary electrons or reflected electrons generated from the surface and proximity of the specimen and converts them to a mirror image signal. The defect detection step detects defects by processing the mirror image signal that is derived from the conversion made in the detection step.

The condition setup process provided by the present invention repeats a charging step, which sheds a charged electron beam on a condition setup region of a condition setup specimen on which a circuit pattern is formed, accomplishes charging, and forms an electrical potential distribution near the condition setup region, a detection step, which sheds a condition setup electron beam on the condition setup region for which the electrical potential distribution is formed in the charging step, allows a detector to detect secondary electrons or reflected electrons generated from the surface and proximity of the specimen, and converts the detected electrons to a mirror image signal, and a discharging step, which subsequently discharges the condition setup region, a number of times while varying the irradiation conditions for the charged electron beam in the charging step, evaluates the optimality in accordance with mirror image signals that are successively derived from the conversion made in the detection step, and determines at least the precharge conditions for the defect inspection process.

Further, the condition setup process provided by the present invention repeats a charging step, a detection step, and a discharging step, a number of times while varying the irradiation conditions for the charged electron beam in the charging step, evaluates the optimality in accordance with the defect section detection performance of mirror image signals that are successively derived from the conversion made in the detection step, and determines at least the precharge conditions for the defect inspection process. The charging step sheds a charged electron beam on a defect section of a condition setup specimen having a defect, accomplishes charging, and forms an electrical potential distribution near the defect section. The detection step sheds a condition setup electron beam on the defect section for which the electrical potential distribution is formed in the charging step, allows a detector to detect secondary electrons or reflected electrons generated from the surface and proximity of the specimen, and converts the detected electrons to a mirror image signal. The discharging step subsequently discharges the condition setup region Furthermore, the present invention provides a pattern defect inspection apparatus that includes charge generation means, which sheds a charging electron beam on an inspection region of a specimen on which a circuit pattern is formed, accomplishes charging, and generates an electrical potential distribution near the inspection region; electron beam irradiation means, which sheds a mirror electron projection or multiple electron beam on a detection region for which an electrical potential distribution is formed near the inspection region; detection means, which detects secondary electrons or reflected electrons generated from the surface and proximity of the specimen; and defect detection means, which processes a mirror image signal detected by the detection means to detect defects. The pattern defect inspection apparatus further includes irradiation condition optimization means, which irradiates the inspection region while allowing the charge generation means to vary the irradiation conditions for a charged electron beam, achieves charging, and forms an electric field distribution near the inspection region. When the electron beam irradiation means sheds a mirror electron projection or multiple electron beam on the inspection region for which the electric field distribution is formed, the irradiation condition optimization means optimizes the charged electron beam irradiation conditions for defect inspection in accordance with the mirror image signal detected by the detection means.

Moreover, the present invention is a mirror electron projection type or multi-beam scanning type scanning electron beam apparatus that includes a stage, which supports and moves a specimen; a charging device, which sheds a charging electron beam on the specimen to charge an inspection region and form an electrical potential distribution near the inspection region; an electron beam irradiation/detection optics, which sheds a mirror electron projection or multiple electron beam on the inspection region for which the electrical potential distribution is formed by the charging device, allows a detector to detect secondary electrons or reflected electrons generated from the surface and proximity of the specimen, and converts the detected electrons to a mirror image signal; an image processing section, which detects defects by processing the mirror image signal that is derived from the conversion made in the electron beam irradiation/detection optics; and a discharging device, which achieves discharging by irradiating the specimen with a discharge beam.

The present invention makes it possible to set optimum precharge conditions for a mirror electron projection type or multi-beam scanning type scanning electron beam apparatus and mirror image detection conditions, and quickly detect defects in a semiconductor wafer (specimen) in accordance with a mirror image.

These and other objects, features, and advantages of the invention will be apparent from the following more particular description of preferred embodiments of the invention, as illustrated in the accompanying drawings.

BRIEF DESCRIPTION OF THE DRAWINGS

FIGS. 1A and 1B illustrate a configuration of a mirror electron projection type or multi-beam scanning type scanning electron beam pattern defect inspection system according to a first embodiment of the present invention, including a condition setup process;

FIGS. 2A and 2B illustrate a configuration of a mirror electron projection type or multi-beam scanning type scanning electron beam pattern defect inspection system according to a second embodiment of the present invention, including a condition setup process;

FIG. 5 is a schematic diagram illustrating how a planar mirror electron projection electron beam vertically incident on an equipotential surface near the uppermost surface of a specimen is retracted by an electric field;

DETAILED DESCRIPTION OF THE PREFERRED EMBODIMENTS

Figure 3:
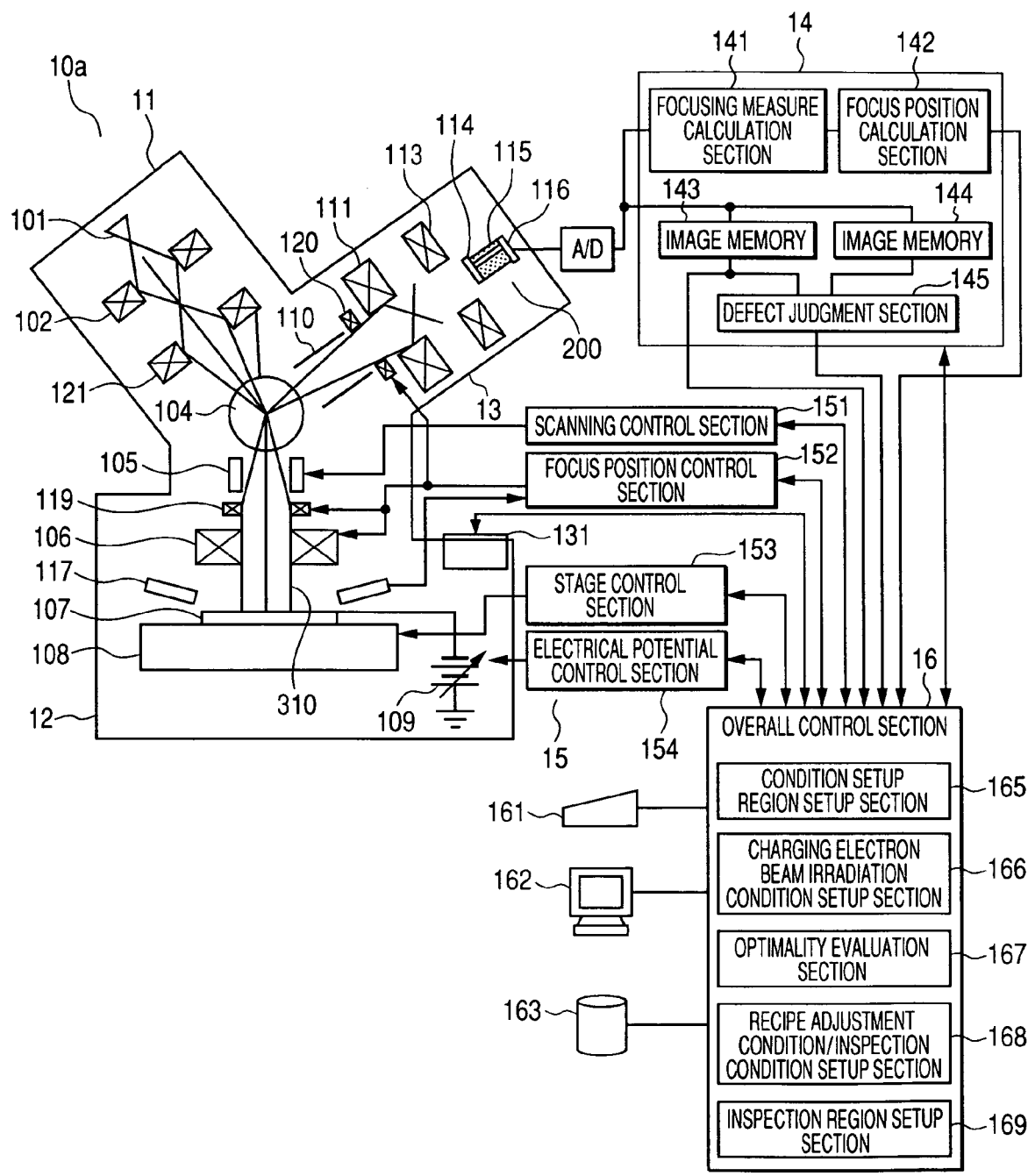
FIG. 3 illustrates a configuration of a mirror electron projection type scanning electron beam apparatus, which is the first embodiment of a scanning electron beam apparatus.

Scanning electron beam method and apparatus for pattern defect inspection and inspection condition setup in accordance with embodiments of the present invention will now be described with reference to the accompanying drawings.

First Embodiment

A first embodiment of a method and system configuration for mirror electron projection type or multi-beam scanning type scanning electron beam pattern defect inspection including condition setup will now be described with reference to FIGS. 1A and 1B.

As shown in FIG. 1A, the first embodiment includes an SEM 102, which acquires defect position information; a mirror electron projection (MPJ) type (secondary electron projection (SEPJ) type included) or multi-beam scanning type inspection machine for condition setup 1010, which performs condition setup; a plurality of mirror electron projection type (MPG type (SEPJ type included) or multi-beam scanning type in-line inspection machines 1000a-1000c; and a network 1030, which interconnects the above devices. The plurality of in-line inspection machines 1000a-1000c are installed by incorporating them into a semiconductor manufacture line. As the mirror electron projection type or multi-beam scanning type inspection machine for condition setup 1010, any one of the plurality of in-line inspection machines 1000a-1000c may be used. Consequently, as shown in FIG. 1B, the defect position information is acquired by the SEM 1020 (S100), condition setup is performed by the mirror electron projection type or multi-beam scanning type inspection machine 1010 (S200), and a defect inspection is conducted by the mirror electron projection type or multi-beam scanning type inspection machines 1000a-1000c in accordance with the condition setup (S300). The SEM 1020 and the inspection machines 1010, 1000a-1000c will be described in detail later. A defect position information acquisition process S100, a condition setup process S200, and a defect inspection process S300 will also be described in detail later.

Second Embodiment

A second embodiment of a method and system configuration for mirror electron projection type or multi-beam scanning type scanning electron beam pattern defect inspection including condition setup will now be described with reference to FIGS. 2A and 2B.

As shown in FIG. 2A, the second embodiment includes an SEM 1020, which doubles as an MSEM (The MSEM in the SEM is configured to adjust the electrical potential of an electrode on the specimen so that incident beam electrons' kinetic energy prevailing directly above the specimen is approximately zero.) to acquire defect position information and perform condition setup; a plurality of mirror electron projection type (MPJ type (SEPJ type included) or multi-beam scanning type in-line inspection machines 1000a-1000c; and a network 1030, which interconnects the above devices. The plurality of mirror electron projection type or multi-beam scanning type in-line inspection machines 1000a-1000c are installed by incorporating them into a semiconductor manufacture line. The MSEM function incorporated in the SEM 1020 is used as a condition setup inspection machine 1020. Consequently, as shown in FIG. 2B, the defect position information is acquired by the SEM 1020 (S100), condition setup is performed by the MSEM function of the SEM 1020 (S400), and defect inspection is conducted by the mirror electron projection type or multi-beam scanning type in-line inspection machines 1000a-1000c in accordance with the condition setup (S300). The SEM 1020, which doubles as an MSEM, and the mirror electron projection type or multi-beam scanning type inspection machines 1000a-1000c will be described in detail later. A defect position information acquisition process S100, a condition setup process S400, and a defect inspection process S300 will also be described in detail later.

FIRST EXAMPLE

Figure 4A:
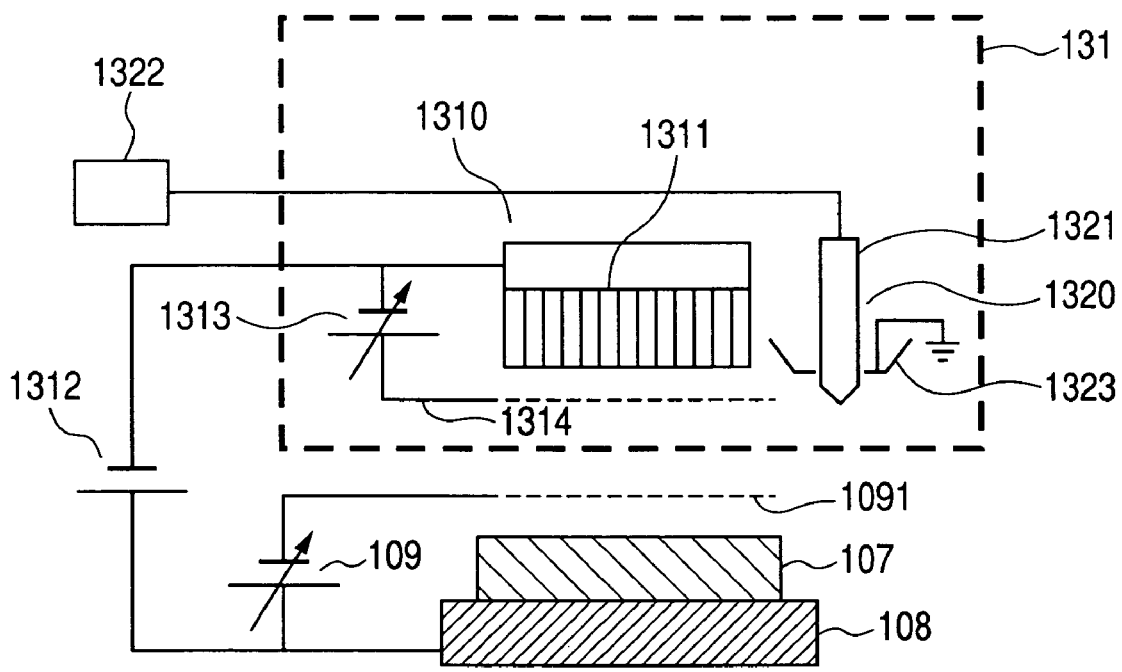
FIG. 4A illustrates a configuration of a charging/discharging control device according to an embodiment of the present invention.
Figure 4B:
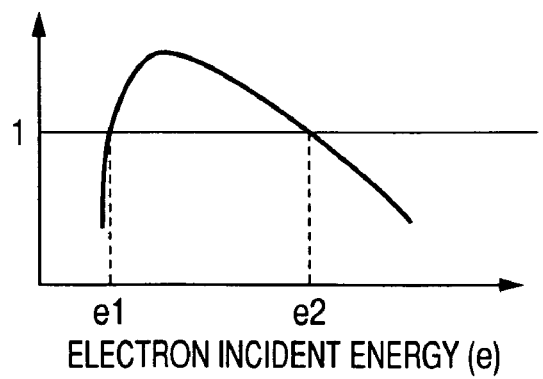
FIG. 4B is a graph illustrating the relationship between electron incident energy and secondary electron emission efficiency.

A mirror electron projection type (MPJ type (SEPJ type included) inspection machine (scanning electron beam apparatus) 10a, which is the first example of scanning electron beam apparatuses (inspection machines) 1000, 1010 for use in defect inspection and condition setup according to the present invention will now be described with reference to FIGS. 3, 4A, and 4B. The MPJ type scanning electron beam apparatus uses a method of mirror electron detection based on mirror electron projection, which emits a planar electron beam. The SEPJ type scanning electron beam apparatus uses a method of secondary electron detection based on mirror electron projection, which emits a planar electron beam. FIG. 3 shows a configuration of the first example of a scanning electron beam apparatus according to the present invention. Roughly speaking, the first example includes an electron irradiation optics 11, a specimen chamber 12, an electron image formation optics 13, an image processing section 14, various control sections 15, and an overall control section 16. The various control sections 15 include a scanning control section 151, which controls an irradiation system deflector 105 and an image formation system deflector 110; a focus position control section 152, which controls an objective lens 106, focus correction coil 1 (119), and focus correction coil 2

(120); a stage control section 153, which controls a stage 108; and an electrical potential control section 154, which controls a power supply (electric field generation means) 109. The overall control section 16 exercises overall control over the various control sections 15, image processing section 14, and the like.

The electron irradiation optics 11 includes an electron source 101, condenser lenses 102, 121, a beam separator 104, the irradiation system deflector 105, focus correction coil 1 (119), and the objective lens 106, and is configured to irradiate a specimen's detection region with a mirror electron projection (planar) electron beam 310.

The electron image formation optics 13 includes the image formation system deflector 110, focus coil 2 (120), an image formation lens 111, a contrast aperture 112, a magnifying lens 113, and a detector 200. The detector 200 includes a fluorescent plate 114, an optical fiber bundle 115, and a line sensor section 116 that is one- or two-dimensional CCD, such as TDI (Time Delay Integration)-CCD, and detects an electron beam image that is produced by secondary electrons or reflected electrons generated from the surface and proximity of the detection region of a specimen 107.

The specimen chamber 12 includes a transport stage 108, a power supply 109, and an optical height sensor 117. The transport stage 108 supports the specimen 107 and is moved at least in X- or Y-direction by the stage control section 153. The power supply 109 functions as electric field generation means, which generates an electric field to retract an electron beam from the proximity of the surface of the specimen (inspection target) 107. The negative potential of the power supply 109 is controlled by the electrical potential control section 154. The optical height sensor 117 optically detects the surface height of the specimen 107.

Further, the specimen chamber 12 includes a charging/discharging control device 131, which irradiates the detection region of the specimen 107 with a main electron beam to detect secondary electrons or reflected electrons from the surface and proximity of the specimen, irradiates the specimen 107 with a charging electron beam (planar electron beam) to apply a positive or negative charge to the detection region before the detection of an image for defect inspection and an image for calculating a precharge optimality evaluation index, forms an electrical potential distribution near the detection region, detects a mirror image for inspection and a mirror image for calculating the optimality evaluation index, and irradiates the detection region of the specimen 107 with a discharging ion shower or electron shower to discharge the detection region. As shown in FIG. 4A, the charging/discharging control device 131 includes a charging device 1310, which applies a positive or negative charge to the surface of the specimen 107 by irradiating it with a charging electron beam, and a discharging device 1320, which discharges the surface of the specimen 107 by irradiating it with a discharging charged particle beam shower. When the power supply 1312 is connected to the charging device 1310, the charging device 1310 emits a large-current electron beam from a planar electron source 1311 having a certain extent (a bundle of carbon nanotubes, a tungsten filament thermal electron beam source, or the like). An extraction electrode 1314 to which a power supply 1313 is connected extracts electrons. In a situation where a control electrode 1091 to which the power supply 109 is connected is controlled, the specimen surface is positively charged when the electron energy (e) incident on the specimen surface is in the condition $e<e1$ or $e2<e$ to provide a secondary electron emission efficiency of greater than 1.0, and is negatively charged when the electron energy incident on the specimen surface is in the condition $e1<e<e2$ to provide a secondary electron emission efficiency of smaller than 1.0, as shown in FIG. 4B. The discharging device 1320 includes, for instance, an electrode needle 1321 to which a high-voltage power supply 1322 is connected, and a grounded ground plate 1323. When their electrical current values are controlled, the discharging device 1320 individually adjusts the amounts of generation of plus and minus ions. The charging device 1310 may double as the discharging device to control the control electrode 1091 so as to adjust the secondary electron emission efficiency in a manner that is opposite to the case of charging.

As described above, the charging device 1310 can irradiate the detection region with a charging electron beam, charge an electrical defect in the detection region positively or negatively in relation to a normal section, and cause the shape of an equipotential surface on the specimen surface near the electrical defect to differ from that of the normal section. Consequently, the electrical defect becomes obvious in a mirror electron image. Further, the discharging device 1320 can discharge a charged region by irradiating it with an ion shower. Furthermore, the charging device 1310 can discharge a charged region by irradiating it with an electron shower. In this manner, a charged region can be discharged by irradiating it with a charged particle beam shower.

The image processing section 14 includes a focusing measure calculation section 141, a focus position calculation section 142, image memories 143, 144, and a defect judgment section 145. When a focus map is to be created or when an inspection is to be conducted, the focusing measure calculation section 141 measures the focusing measure with reference to the specimen surface height detected by the optical height sensor 117 and in accordance with an electron image signal detected by a focusing sensor section (installed in the detector 200). The focus position calculation section 142 calculates the height of a confocal plane (focused focal point plane), which is conjugate to a planar electron beam's convergence plane generated, for instance, by an objective lens, with respect to the image formation optics (electron image formation optics) 13 and in accordance with the measured focusing measure, calculates the focus position of the objective lens in accordance with the calculated confocal plane height so that the sensor section 200 detects a focusing inspection image of the inspection region of the inspection target, and outputs the calculated focus position to the overall control section 16. The image memory 143 stores an inspection image signal (inspection mirror image signal) that the sensor section 200 detects from the inspection target. The image memory 144 stores a reference image signal that is compared against the inspection image signal and obtained from different dies repeated, for instance, on the specimen. The defect judgment section 145 detects defects or defect candidates by comparing the inspection image signal against the reference image signal (or a threshold value image signal) that is free from defects.

The overall control section 16 is connected to a display 162 that displays a GUI and the like, and to a storage device 163 that stores a focus map and inspection target layout and other data. The overall control section 16 includes a condition setup region setup section 165 based on a GUI and the like, a charging electron beam irradiation condition setup section 166 that uses a GUI and the like, an optimality evaluation section 167 based on a CPU and the like, a recipe adjustment condition/inspection condition setup section 168 that sets the electron beam irradiation/detection conditions for condition setup by the electron irradiation optics 11 and electron image formation optics 13 as recipe adjustment conditions, and sets the electron beam irradiation/detection conditions for defect inspection as inspection conditions, and an inspection region setup section 169 that is based on a GUI and the like. For an inspection machine that uses an MSEM for condition setup or does not perform condition setup, the condition setup region setup section 165, charging electron beam irradiation condition setup section 166, optimality evaluation section 167, and recipe adjustment condition setup section are not always required. Condition setup for the MPJ type scanning electron beam apparatus, which is a feature of the present invention, will be described in detail later.

First of all, the electron irradiation optics 11 will be described below. An accelerated electron beam emitted from the electron source 101 to which a negative high potential is applied by an accelerating power supply (not shown) is converged by the condenser lenses 102, 121, A Zr/O/W type Schottky electron source is used as the electron source 101. When this electron source is used, a planar electron beam, which is a large-current beam (e.g., 1.5 µA), has an energy width of less than 1.5 eV, and is a uniform mirror electron projection, can be stabilized. The beam separator 104 separates for an incident electron beam from the electron source 101 and a mirror electron beam from the specimen (inspection target) 107. The condenser lenses 102, 121 form a crossover in the front focal plane of the objective lens 106.

Under the above circumstances, a planar electron beam 310 is formed toward the surface of the specimen 107. This electron beam is perpendicular to the surface of the specimen 107, contains electrons whose paths are virtually parallel to each other. This planar electron beam 310 can be moved to an arbitrary position on the surface of the specimen 107 (or scanned) by the irradiation system deflector 105, which is controlled by the scanning control section 151.

Even if the front focal plane of the objective lens 106 is not perfectly aligned with the crossover position, no problem arises as far as the displacement between the front focal plane and crossover position is within an acceptable range. Further, the magnitude of the crossover is ideally zero. In reality, however, the crossover has a depending on the aberrations of an electron gun and condenser lenses. This magnitude is permissible as far as it is within an acceptable range. In the electron irradiation optics 11 in which the crossover position is accurately controlled with the aberrations of the electron gun 101 and condenser lenses 102, 121 adequately reduced, the extent of a specimen incidence angle is one of the factors that determine the resolution of a magnified image of the specimen surface, which is generated by mirror electrons, and is expressed by Equation (1) below:

$$r0 = \beta^2 \times Zm \quad (1)$$

where r0 is the resolution, which is determined by the extent of the incidence angle, $\beta$ is the maximum incidence half angle, and Zm is the distance over which an electric field for retracting electrons is generated.

In the present example, $\beta$ is 0.25 mrad and Zm is 5 mm. When these values are substituted into Equation (1), r0 is 0.3 nm. It means that the resolution remains unaffected in the present example. Therefore, the beam current can be increased as needed. Even when the resolution is 30 nm or so, it is adequate for semiconductor wafer defect detection. Therefore, if Zm is 5 mm, the maximum permissible value for $\beta$ is 2.4 mrad. In such an instance, the acceptable ranges for the displacement between the objective lens 106 and front focal plane crossover and the magnitude of the crossover are increased.

When a beam opening half angle in the front focal plane is $\alpha$, the focal length of the objective lens 106 is f, the positional displacement of the crossover is $\Delta f$, and the radius of the planar electron beam 310 is X, Equations (2) and (3) are obtained:

$$\Delta f = f \times \beta / \alpha \quad (2)$$

$$\alpha = X/(2f) \quad (3)$$

When, for instance, the focal length f of the objective lens 106 is 10 mm and the size X of the planar beam 310 is 40 µm, Equations (2) and (3) indicate that no problem arises even if the positional displacement $\Delta f$ of the crossover is 10 mm or so. In this situation, the beam diameter in the front focal plane is approximately 40 µm. In any case, it is obvious that adequate resolution is obtained when the crossover of the mirror electron projection electron beam is positioned near the front focal plane of the objective lens 106.

The beam separator 104 will now be described. The beam separator 104 deflects the mirror electron projection electron beam, which is emitted from the electron source 101, toward the specimen 1007, and deflects the secondary electrons or mirror electrons, which are retracted from the specimen 107, toward the image formation lens 111 instead of the electron source 101. A magnetic-field-based deflector is best suited as a deflector that operates as described above. The reason is that the direction of magnetic-field-based deflection varies with the direction of electron incidence. When the employed optics is such that the optical axis of the image formation lens 111 is in alignment with the optical axis of the objective lens 106, and deflect only a primary electron beam, which moves downward.

The power supply 109, which is electric field generation means for generating an electric field that retracts a mirror electron projection electron beam from the proximity of the surface of the specimen (inspection target) 107, applies a negative potential having a slightly greater absolute value than that of the electron source 101 to the specimen 107 and specimen transport stage 108. The power supply 109 is configured so that the negative potential is controlled by the electrical potential control section 154. More specifically, the power supply 109 should apply a negative potential of 0.5 to 5 V to the specimen 107. If an excessively high negative potential is applied, the image resolution deteriorates. If, on the other hand, an excessively low negative potential is applied, surface irregularities and small electrical potential changes are imaged as unduly high contrast items so that it is difficult to detect true defects only. In other words, when the electron image formation optics 13 detects the secondary electrons from the specimen surface, the power supply 109 for applying the negative potential to the specimen 107 and transport stage 108 is used to draw the secondary electrons upward by applying an electric field in order to efficiently collect the secondary electrons that move away from the specimen surface. Further, when the electron image formation optics 13 detects mirror electrons that are reflected from the specimen surface, the power supply 109 is used to apply an electric field to such an extent that emitted beam electrons return from the proximity of the specimen surface.

As described above, the mirror electron projection electron beam deflected by the beam separator 104 is formed into a planar mirror electron projection electron beam 310 by the objective lens 106. This planar mirror electron projection electron beam is uniformly perpendicular to the surface of the specimen (inspection target) 107. The power supply (electric field generation means) 109 applies to the specimen 107 a negative potential that is equal to or slightly higher than the acceleration voltage of the mirror electron projection electron beam. Consequently, an electric field representing the shape of a circuit pattern formed on the surface of the specimen 107 and the charging state is formed.

Thus, the greater part of the planar mirror electron projection electron beam, which is directed perpendicularly to the surface of the specimen (inspection target) 107, is decelerated before the specimen 107 by the aforementioned negative potential, retracted upward by the electric field on the surface of the specimen 107, and moved upward while having the direction and strength reflecting the circuit pattern information about the specimen 107. The secondary electrons or mirror electrons retracted in the above manner are focused by the objective lens 106, and deflected toward the image formation system deflector 110 and image formation lens 111 by the beam separator 104. The image formation lens 111 then images the surface state of the specimen 107 in an image formation plane 112 as a secondary electron beam image or mirror electron beam image.

When the electron beam image formed in the above manner is magnified by the magnifying lens 113 and projected onto the fluorescent plate 114, a fluorescent image (microscope image) that represents the circuit pattern on the surface of the specimen (inspection target) 107 and the charging state is obtained.

Further, the contrast aperture 112 is inserted into the crossover surface in order to improve the contrast and resolution of the above electron beam image. Since the contrast aperture 112 eliminates electrons that are not imaged when they are retracted by a surface electric field of the specimen 107, the fluorescent plate 114 yields a high-resolution, high-contrast microscope image of defects.

Meanwhile, as semiconductors are increasingly miniaturized, it is necessary to detect a charged potential difference of about 1 V in a micropattern as a defect. It is therefore preferred that the electron beam energy width for use in the present invention be not greater than 2 eV. When a Zr/O/W type Schottky electron source is used as the electron source 101, no problem arises because the energy width is less than 1.5 eV as mentioned earlier. If the employed electron source has a greater energy width, it is necessary to furnish an energy filter in an electron beam optical path, and reduce the electron energy width to 2 eV or less during the time interval between the instant at which electrons are emitted from the electron source and the instant at which an image is eventually formed. It is preferred that the energy filter be installed between the electron source 101 and specimen 107. However, the same effect is produced even when the secondary electrons or mirror electrons emitted from the specimen 107 are subjected to energy filtering.

When mirror electrons are to be detected, the mirror electron projection electron beam does not collide against the specimen 107. Therefore, the surface of the specimen 107 does not generally become charged even when an insulating film exists on it. When an inspection is conducted while charging is not achieved, three-dimensional shape defects (whose shape differs from that of a normal portion) can be detected. Further, to make a short or other electrical defect obvious as a mirror image, the charging device 1310 of the charging/discharging control device 131 irradiates the inspection target with a charging electron beam (charging electron beam shower) before the detection of an inspection image, charges an electrical defect in the detection region positively or negatively relative to a normal section as shown in FIG. 5, and causes the shape of an equipotential surface 320 of the specimen surface near the electrical defect to differ from that of the normal section. Consequently, the electrical defect becomes obvious within a mirror electron image. Subsequently, the discharging device 1320 of the charging/discharging control device 131 emits a discharging charged particle shower to achieve discharging and terminate the inspection.

In other words, FIG. 5 schematically shows how the planar mirror electron projection electron beam 310, which is perpendicularly incident upon the equipotential surface 320 near the uppermost surface of the specimen 107, is retracted by an electric field. Due to defects 331, 332 existing on the surface of the specimen 107, the equipotential surface 320 is irregularly shaped at positions at which the defects exist. Therefore, the perpendicularly incident electron beam is not vertically retracted but is retracted at a certain angle as shown, and is incident on a lens that includes the objective lens 106 and image formation lens 111 so that the images of the defects 331, 332 are formed brightly and intensively in the image formation plane 112, that is, the fluorescent plate 114 of the sensor section 200.

Consequently, if a negatively charged defect (convex defect) 331 exists, the focus position (focused focal point position) 341 is below the surface of the specimen 107 (shifted in the negative direction). Retraction then occurs at a certain angle as if mirror electrons were generated from the focus position 341. An image is then formed in the image formation plane 112 so that the image of a convex defect is detected. If, on the other hand, a positively charged defect (concave defect) 332 exists, the focus position (focused focal point position) 342 is above the surface of the specimen 107 (shifted in the negative direction). Retraction then occurs at a certain angle as if mirror electrons were generated from the focus position (focused focal point position) 342. An image is then formed in the image formation plane 112 so that the image of a concave defect is detected. When the focused focal point position of the sensor section 200 is adjusted for the negatively charged defect 331 as described above, the mirror electrons retracted from the positively charged defect 332 are detected as an image darker than that of a normal surface without being imaged in the image formation plane 112. On the contrary, when the focused focal point position of the sensor section 200 is adjusted for the positively charged defect 332, the mirror electrons retracted from the negatively charged defect 331 are detected as an image darker than that of a normal surface without being imaged in the image formation plane. Further, the focused focal point position (focused focal point plane) varies with the size of a convex defect or concave defect.

Further, when the irradiation region with irradiated with the planar electron beam 310 in a situation where the sensor section 200 includes a plurality of sensor sections that are lined up and different in focusing position, an image produced by mirror electrons that are reflected from the equipotential surface 320 near the uppermost surface of the specimen 107 can be detected virtually simultaneously by the sensor sections 1, 2, 3 as inspection images 1, 2, 3, which differ in the focused focal point position. Inspection image 1 is an image that is focused in relation to the negatively charged defect (convex defect) 331. Inspection image 2 is an image that is focused in relation to the surface of the specimen 107. Inspection image 3 is an image that is focused in relation to the positively charged defect (concave defect) 332. When inspection images 1, 2, and 3, which differ in the focused focal point position, are detected in the above manner, the defect judgment section 145 in the image processing section 14 can compare the detected inspection images against a defect-free reference image and judge the negatively charged defect 331, positively charged defect 332, and other defects with high sensitivity.

The principle of focus position calculation will now be described. First of all, a reference height is determined by making measurements at a measurement point on the specimen or at a focusing position with the optical height sensor 117. The overall control section 16 then successively sets the focus position of the objective lens 106 to a plurality of different heights (focus offsets) for the focus position control section 152 with reference to the determined reference height. If the transport stage 108 includes a Z stage, the specimen surface can be adjusted for the reference height. Next, with the focus position changed to the plurality of successively set different heights, the focus position control section 152 causes the electron irradiation optics 11 to irradiate the measurement point or focusing position with a planar electron beam 310, and allows the sensor section 200 to detect a secondary electron beam image or mirror electron beam image that is derived from the prevailing measurement point or focusing position. The focusing measure calculation section (focusing measure measurement section) 141 measures the focusing measure in accordance with a detected electron beam image signal. As regards the image formation optics 13, which is indicated at a peak position in accordance with the measured focusing measure, the focus position calculation section 142 can calculate the height (focusing position) of a confocal plane, which is conjugate to a planar electron beam's convergence plane, and calculate the focus position of the objective lens 106, including the focus correction coils 119, 120, in accordance with the calculated confocal plane height (focusing position) so that the sensor section 200 detects a focusing inspection image in the inspection region on the specimen surface.

SECOND EXAMPLE

Figure 6:
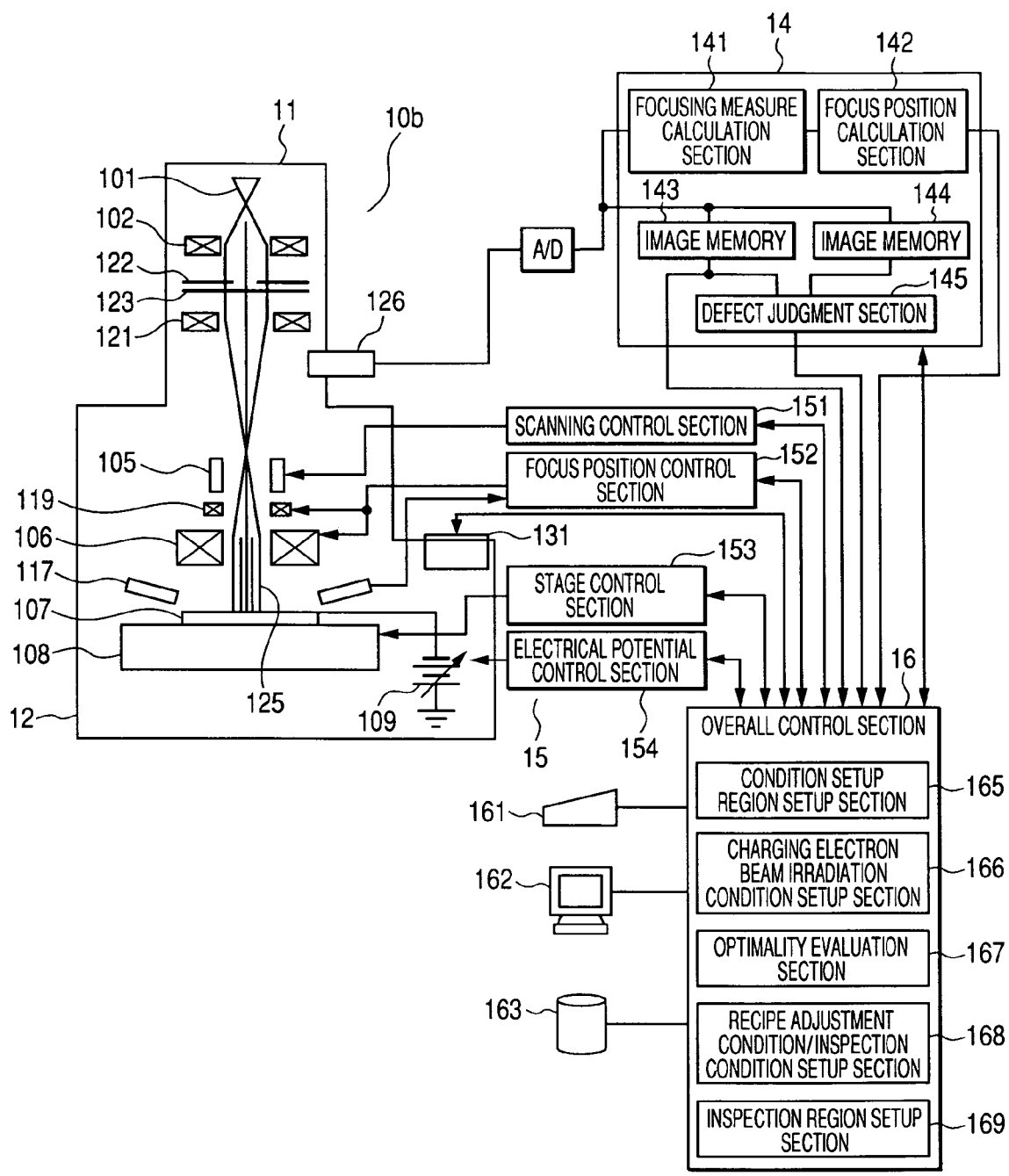
FIG. 6 illustrates a configuration of a multi-beam scanning type scanning electron beam apparatus, which is the second embodiment of a scanning electron beam apparatus.

A multi-beam scanning type scanning electron beam apparatus 10b, which is a second example of the scanning electron beam apparatus (inspection machine) 1000, 1010 for use in defect inspection and condition setup according to the present invention, will now be described with reference to FIG. 6. The multi-beam scanning type scanning electron beam apparatus emits multiple electron beams (a plurality of point electron beams) and uses a mirror electron projection-based method of detecting secondary electrons or reflected electrons. The difference between the second example and first example lies in a multi-beam formation optics and a detection optics and detector for detecting secondary electrons or reflected electrons from the surface and proximity of a specimen upon emission of multiple beams 125. The multi-beam formation optics includes an aperture array 122 and a lens array 123. A multi-detector 126 is employed as the detector. In the configuration shown in FIG. 6, the multi-detector 126 detects secondary electrons.

THIRD EXAMPLE

A third example of the SEM 1020, which doubles as an MSEM to acquire defect position information according to the present invention and perform setup, will now be described with reference to FIG. 7. Elements that are used in the third example and identified by the same reference numerals as their counterparts shown in FIGS. 3 and 6 are identical with the counterparts. The employed configuration is such that a detector 121 detects secondary electrons or reflected electrons from the specimen 107.

The MSEM in the SEM is configured to adjust the electrical potential of an electrode on the specimen 107 so that incident beam electrons' kinetic energy prevailing directly above the specimen is approximately zero.

FOURTH EXAMPLE

A fourth example, which includes a condition setup process (S200) performed by a mirror electron projection type or multi-beam scanning type inspection machine 1010 according to the present invention shown in FIG. 1B and a defect inspection process (S300) performed by a mirror electron projection type or multi-beam scanning type inspection machine 1000 according to the present invention shown in FIG. 1B, will now be described in detail with reference to FIGS. 8A and 8B.

Figure 8A:
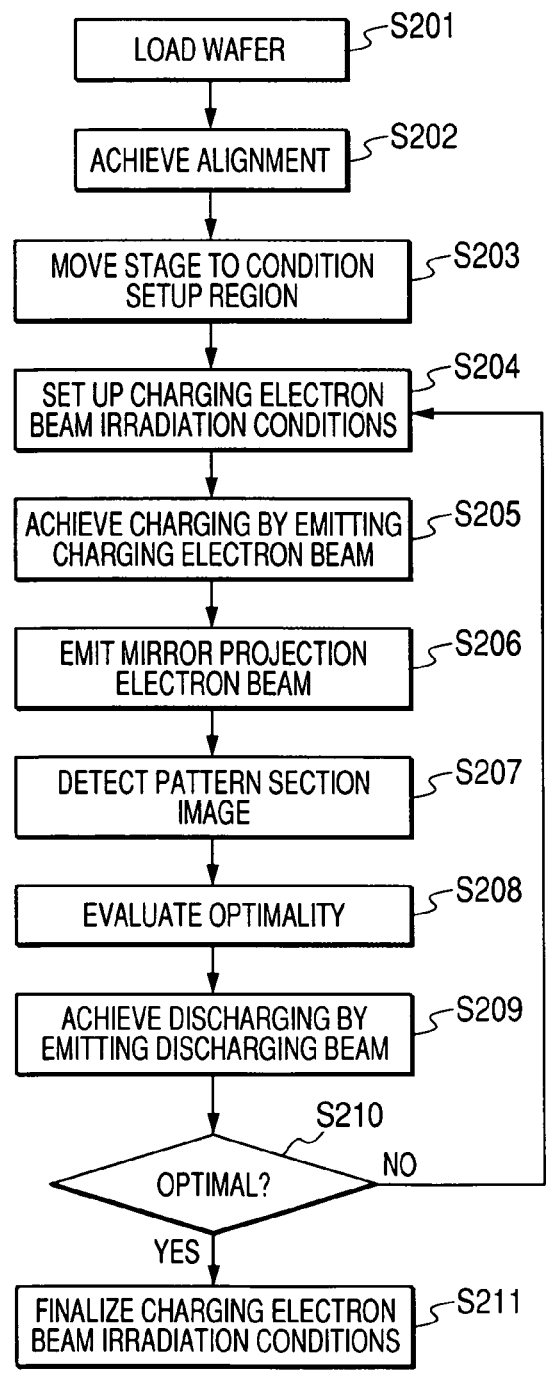
FIG. 8A is a flowchart illustrating an off-line condition setup process performed by a mirror electron projection type or multi-beam scanning type scanning electron beam apparatus.

FIG. 8A is a flowchart illustrating an off-line condition setup process that is performed by the mirror electron projection type or multi-beam scanning type inspection machine 1010. First of all, a condition setup semiconductor wafer 107a on which a circuit pattern is formed is loaded into the mirror electron projection type or multi-beam scanning type inspection machine 1010 (step S201). After the loaded semiconductor wafer 107a is placed on the stage 108, an alignment optical microscope (not shown) and electron beam microscope detect an alignment mark (not shown) or the like to achieve alignment (step S202).

Next, in the condition setup region setup section 165 of the overall control section 16, the stage is moved to a condition setup region having a normal circuit pattern section on the semiconductor wafer 107a that is set in accordance, for instance, with CAD information (step 203). Next, the charging electron beam irradiation condition setup section 166 of the overall control section 16 is used to set the charging electron beam irradiation conditions (precharge conditions) for the condition setup region with a GUI screen or the like, which appears on the display device 162. In this instance, the charging electron beam irradiation conditions that have been previously set for a semiconductor wafer for the same production process and are stored in the storage device 163 may be used. The charging device 1310 of the charging/discharging control device 131 then achieves charging (precharging) by irradiating the condition setup region with a charging electron beam (electron shower) under the set irradiation conditions (precharge conditions) (step S205).

Next, the electron irradiation optics 11 irradiates the condition setup region with a mirror electron projection (planar) electron beam 310 or multi-electron beam 125 under mirror electron projection or multiple electron beam irradiation conditions (e.g., the magnification, electrical current amount, sampling rate, and visual field (inspection region) for a mirror electron projection or multiple electron beam) that are set for condition setup by the recipe adjustment condition setup section 168 (step S206). The detector 200 of the electron image formation optics 13 then detects a circuit pattern section mirror image under detection conditions (e.g., image formation position (focus condition)) that are set for condition setup by the recipe adjustment condition setup section 168 (step S207). Further, a contrast or other circuit pattern section characteristic is calculated from a circuit pattern section mirror image signal that is detected and subjected to analog-to-digital conversion in the image processing section 14.

Next, the optimality evaluation section 167 of the overall control section 16 evaluates the optimality of the contrast, which is a circuit pattern section characteristic obtained from the image processing section 14 (step S208). The discharging device 1320 of the charging/discharging control device 131 then achieves discharging by irradiating the condition setup region with a discharging charged particle beam shower (step S209). If the judgment result obtained in step S210 or optimality evaluation step indicates that the contrast, which is a circuit pattern section characteristic, is not optimal, processing returns to step S204. Steps S204 to S210 are then repeated with new charging electron beam irradiation conditions (precharge conditions) set.

If the judgment result obtained in step S210 indicates that the contrast is optimal, the charging electron beam irradiation conditions are finalized and stored in the storage device 163 of the mirror electron projection type or multi-beam scanning type inspection machine for condition setup 1010. In this instance, the mirror image detection conditions (mirror electron projection or multiple electron beam irradiation conditions (e.g., magnification, electrical current amount, sampling rate, and visual field (inspection region) for a mirror electron projection or multiple electron beam)) related to the contrast, which is a circuit pattern section characteristic, and the secondary electron or reflected electron detection conditions (e.g., image formation position (focus conditions)) are also subjected to optimality evaluation, determined, and stored in the storage device 163. The information, for instance, about the mirror image detection conditions (mirror electron projection or multiple electron beam irradiation conditions and secondary electron or reflected electron detection conditions) related to the contrast, which is a circuit pattern section characteristic and set and determined for condition setup by the recipe adjustment condition setup section 168, the condition setup region, and the finalized charging electron beam irradiation conditions (precharge conditions) is transmitted from the storage device 163 of the mirror electron projection type or multi-beam scanning type inspection machine for condition setup 1010 to the in-line inspection machines 1000a-1000c via the network 1030 and stored in the storage device 163. Further, the charging electron beam irradiation conditions and mirror image detection conditions (e.g., mirror electron projection or multiple electron beam irradiation conditions and secondary electron or reflected electron detection conditions) related to the contrast, which is a circuit pattern section characteristic, are set.

As regards the irradiation/detection conditions, for instance, for a mirror electron projection or multiple electron beam, the recipe adjustment conditions for condition setup provide higher resolution than the defect inspection conditions for defect inspection. In other words, the recipe adjustment conditions adjust, for instance, the magnification, electrical current amount, sampling rate, and visual field for a mirror electron projection or multiple electron beam so as to provide higher resolution (a smaller pixel size) than the defect inspection conditions. Further, the focus position (focus conditions) and mirror position in the electron image formation optics 13 can be determined by performing calibration with a standard test piece. As described above, the charging electron beam irradiation conditions and mirror image detection conditions are set up in the condition setup MPJ inspection machine 1010 in accordance with a circuit pattern section mirror image appropriate for the type of a condition setup semiconductor wafer (manufacturing process and lot included).

Figure 8B:
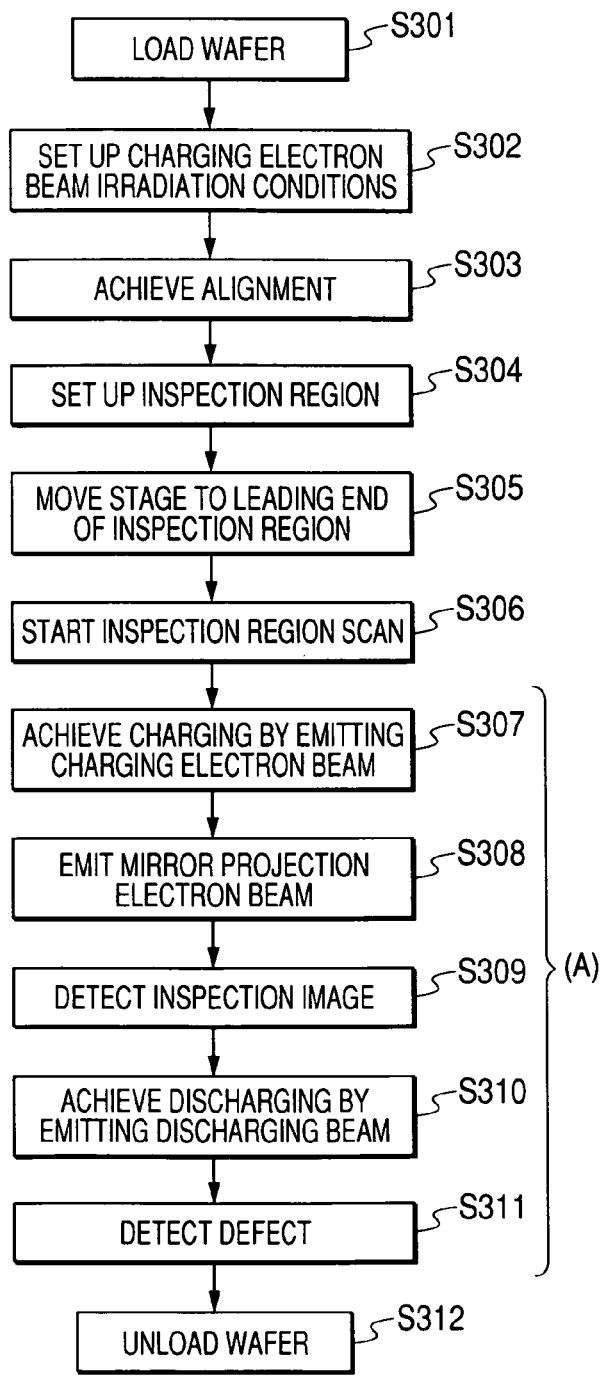
FIG. 8B is a flowchart illustrating a defect inspection process performed by a mirror electron projection type or multi-beam scanning type scanning electron beam apparatus in accordance with a fourth embodiment of the present invention.

FIG. 8B is a flowchart illustrating a defect inspection process that is performed by the mirror electron projection type or multi-beam scanning type inspection machine 1000. First of all, a defect inspection semiconductor wafer 107 on which a circuit pattern is formed is loaded into the mirror electron projection type inspection machine 1000 (step S301). The charging electron beam irradiation conditions appropriate for the type of the loaded semiconductor wafer 107 are set up by the setup section 166 (step S302). Next, an alignment optical microscope (not shown) and electron beam microscope detect an alignment mark (not shown) or the like on the stage 108 to achieve alignment (step S303). The inspection region setup section 169 of the overall control section 16 then sets an inspection region on the semiconductor wafer 107 in a manner described later (step S304). Next, the stage moves to a leading end of the inspection region that is set on the semiconductor wafer 107 (step S305). A stage scan of the inspection region then starts (step S306). Next, the charging device 1310 of the charging/discharging control device 131 achieves charging (precharging) by irradiating the inspection region with a charging electron beam (electron shower) under the set irradiation conditions (precharge conditions) (step S307). The electron irradiation optics 11 then irradiates the inspection region with a mirror electron projection electron beam 310 or the like under the mirror electron projection or multiple electron beam irradiation conditions that are set by the inspection condition setup section 168 for inspection purposes (to provide lower resolution than the conditions set up for condition setup purposes) (step S308). Then, the detector 200 of the electron image formation optics 13 detects an inspection image under the detection conditions that are set by the inspection condition setup section 168 for inspection purposes (step S309). The inspection condition setup section 168 can also perform setup in accordance with the mirror image detection conditions (e.g., mirror electron projection or multiple electron beam irradiation conditions and secondary electron or reflected electron detection conditions) that are determined as the recipe adjustment conditions.

In the above instance, the overall control section 16 reads the associated specimen focus map stored in the storage device 163, sets an estimated focus position F (i,j; x,y) of a measurement point associated with the inspection region for the focus position control section 152 as a focus offset initial value for a focusing point search with reference to the reference height s (i,j; x,y) measured by the optical height sensor 117, causes the electron irradiation optics 11 to irradiate the leading end of the inspection region with a planar beam 310 by using the set focus offset for the objective lens 106, causes the sensor section 200 to detect a secondary electron beam image or mirror electron beam image from the leading end of the inspection region, and measures the focus position (focusing position) f (i,j; x,y) at the leading end of the inspection region. Next, the overall control section 16 moves the transport stage 108 in scanning direction via the stage control section 153 and begins to perform a scan of the inspection region with a mirror electron projection electron beam 310. Further, the overall control section 16 corrects the focus position by controlling, for instance, the focus correction coils 119, 120 in accordance with real-time measurements of the focus position f via the focus position control section 152.

When an inspection region image is detected, the discharging device 1320 of the charging/discharging control device 131, for example, achieves discharging by irradiating the inspection region with a discharging charged particle beam shower (step S310). Next, the defect judgment section 145 compares the inspection image signal, which is detected and analog-to-digital converted in the image processing section 14 and stored in an image memory 143, against the reference image signal stored in another image memory 144, and detects a defect if the image signal difference is greater than a predetermined threshold value (step S311). The obtained inspection result information can be stored in the storage device 163 and output. While the semiconductor wafer 107 is being inspected, steps S307 to S311 are repeated with the transport stage 108 moved for each inspection region (die-related region) within the detection width (the width in the longitudinal direction of a TDI sensor) on the specimen (wafer) 107, and the focus position is repeatedly corrected.

FIFTH EXAMPLE

Figure 9A:
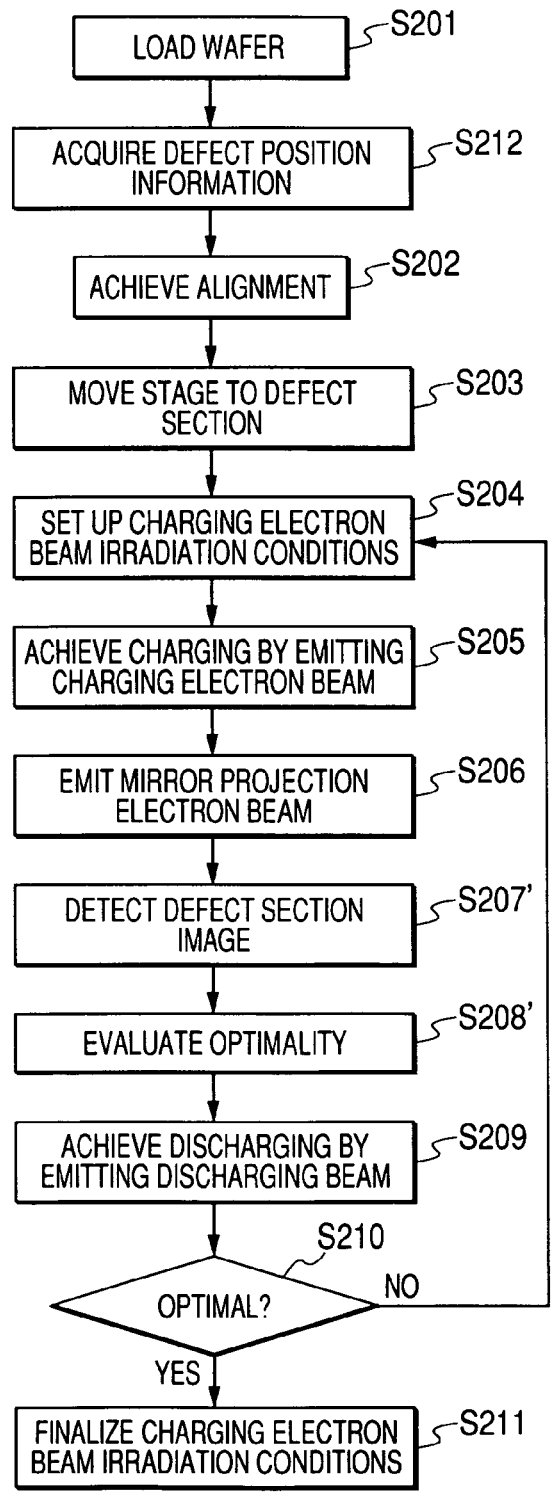
FIG. 9A is a flowchart illustrating an off-line condition setup process performed by a mirror electron projection type or multi-beam scanning type scanning electron beam apparatus.

A fifth example, which includes a condition setup process (S200) performed by a mirror electron projection type or multi-beam scanning type inspection machine 1010 according to the present invention shown in FIG. 1B and a defect inspection process (S300) performed by a mirror electron projection type or multi-beam scanning type inspection machine 1000 according to the present invention shown in FIG. 1B, will now be described in detail with reference to FIGS. 9A and 9B. As shown in FIG. 9A, the condition setup process according to the fifth example differs from the condition setup process according to the fourth example in that the employed semiconductor wafer 107a, which is loaded for condition setup purposes, contains a defect that is detected by the SEMI 1020 for position information acquisition. Further, the position information about the defect is acquired from the SEM 1020 in step S212. Furthermore, step S207' or image detection step is performed to detect a mirror image of the defect, and step S208' or optimality evaluation step is performed to evaluate the defect detection capability, that is, the optimality for detecting a defect, which is a density difference (difference image) that can be rendered obvious.

According to the fifth example, it is possible to evaluate and determine at least the optimality of precharge conditions, which represent the charging electron beam irradiation conditions and affect the defect detection capability. Further, the fifth example makes it possible to evaluate the optimality of the other detection conditions (image formation position (focus condition) and mirror electron projection or multiple electron beam magnification, electrical current amount, sampling rate, and visual field, etc.) and image processing conditions (e.g., defect judgment threshold value), which affect the defect detection capability. Therefore, the inspection condition setup section 168 can set up the above-mentioned detection conditions and image processing conditions so that the defect detected in advance, for instance, by the SEM 1020 in accordance with an SEM image can be detected by the mirror electron projection type or multi-beam scanning type inspection machine 1000. When condition setup is to be performed, it is necessary to use higher resolution for optimality evaluation than for defect inspection. Consequently, the above detection conditions differ in resolution.

Figure 9B:
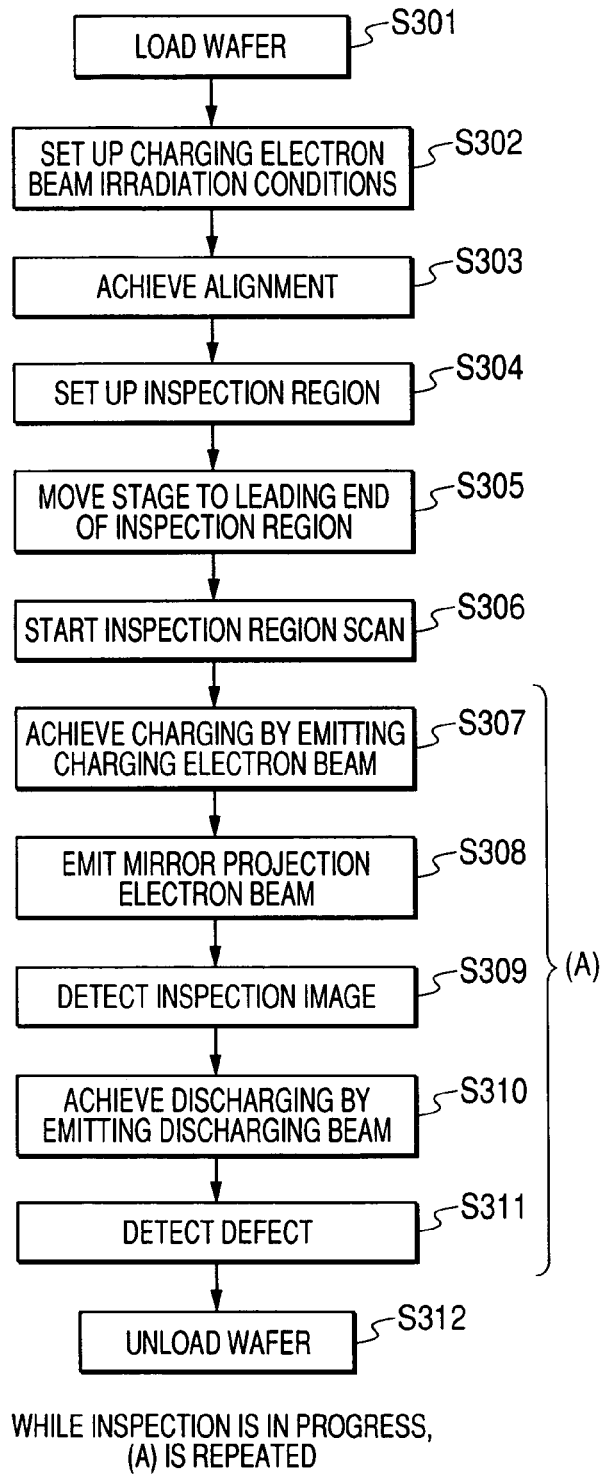
FIG. 9B is a flowchart illustrating a defect inspection process performed by a mirror electron projection type or multi-beam scanning type scanning electron beam apparatus in accordance with a fifth embodiment of the present invention.

The defect inspection process according to the fifth example, which is shown in FIG. 9B, is performed in the same manner as for the fourth example shown in FIG. 8B.

SIXTH EXAMPLE

Figure 10:
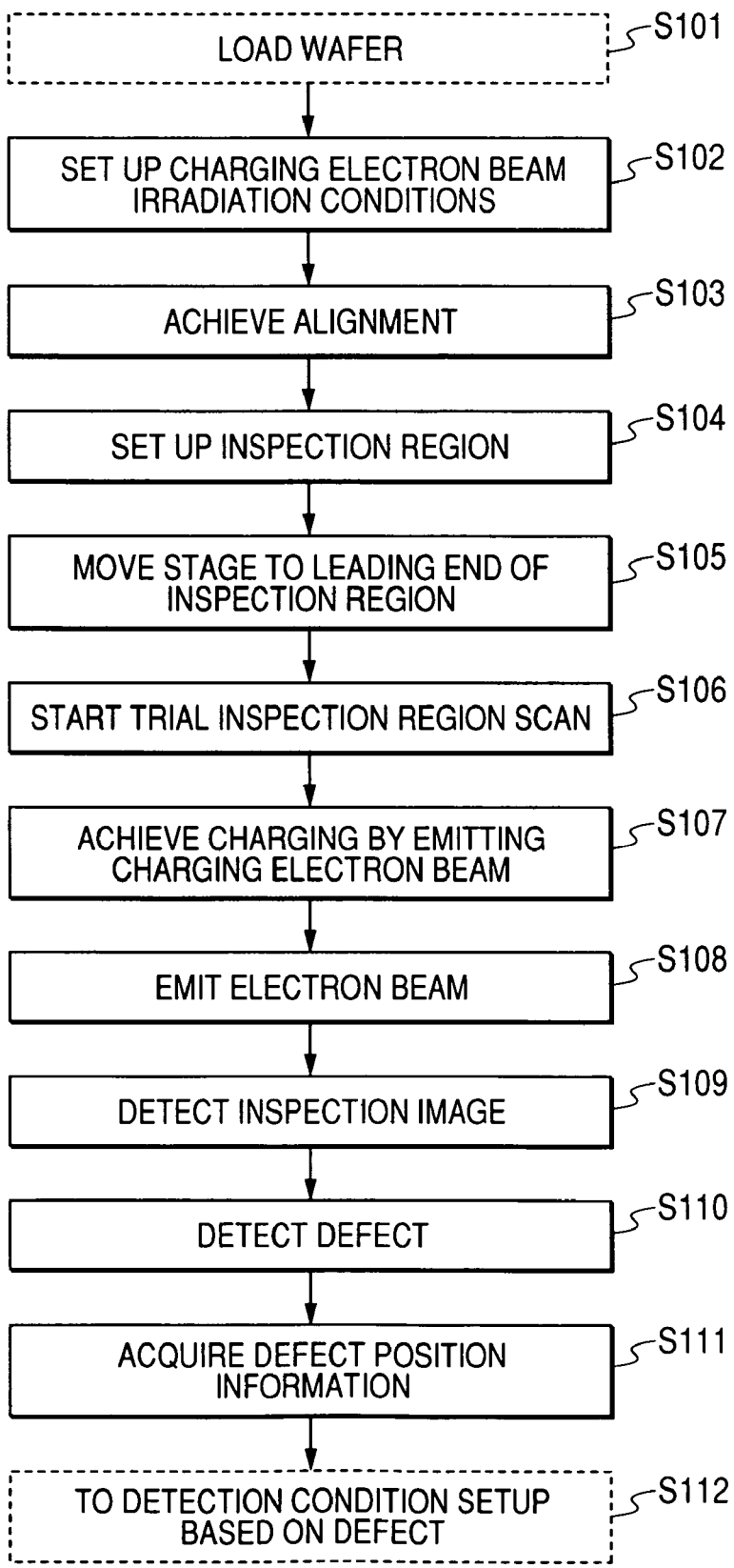
FIG. 10 is a flowchart illustrating a sixth embodiment of the present invention, which is a defect position information acquisition process that is performed by an SEM as a preprocessing operation.

A sixth example of the present invention, which is a defect position information acquisition process that the SEMI 1020 performs as a preprocessing step (S100) shown in FIGS. 1B and 2B, will now be described with reference to FIG. 10. In other words, it is assumed that the employed SEM 1020 is configured as indicated in FIG. 7. First of all, a semiconductor wafer 107a for condition setup, which includes a formed circuit pattern and contains a defect, is loaded into the SEM 1020 (step S101). Next, the charging electron beam irradiation condition setup section 166 of the overall control section 16 sets up the charging electron beam irradiation conditions (step S102). An alignment optical microscope (not shown) included in the SEM then achieves alignment by using an alignment mark that is formed on the semiconductor wafer (step S103). Next, the inspection region setup section 169 sets an inspection region in accordance with the CAD information and defect position outline information about the semiconductor wafer (step S104). The overall control section 16 then moves the stage 108 to the leading end of the set inspection region (step S105), and begins to perform a scan of a trial inspection region (step S106). Next, the charging device 1310 of the charging/discharging control device 131 achieves charging by irradiating the trial inspection region with a charging electron beam (step S107). The electron irradiation optics 11 then irradiates the trial inspection region with an electron beam 128 while exercising focusing control (step S108). Next, the detector 121 detects, for instance, secondary electrons, detects an inspection image, and enters it into the image memory 143 of the image processing section 14 (step S109). The defect judgment section 145 then compares the detected image signal stored in the image memory 143 against the reference image signal stored in another image memory 144, detects a defect in accordance with a density difference (difference image), and transmits a defect detection signal to the main control section 16 (step S110). The main control section 16 extracts position information from the defect detection signal and stores the extracted position information in the storage device 163 (steps S111 and S112). When condition setup is to be performed by the mirror electron projection type inspection machine 1010, the main control section 16 also transmits the extracted position information to the inspection machine 1010 (step S112). In the manner described above, the SEM 1020 is used to acquire the information indicating the existence of many defects in the condition setup semiconductor wafer 107a and the position information about the many defects.

Consequently, it is possible, as described above, to determine and set up the detection conditions (precharge conditions, focus conditions, magnification, electrical current value, sampling rate, visual field (inspection region), etc.) and image processing conditions (e.g., defect judgment threshold value) for the mirror electron projection type or multi-beam scanning type inspection machine 1000 in such a manner that the condition setup inspection machines 1010, 1020 can detect many defects, which are acquired in advance by the SEM 1020.

SEVENTH EXAMPLE

A seventh example, which includes a condition setup process (S400) performed by the MSEM 1020 according to the present invention shown in FIG. 2B and a defect inspection process (S300) performed by the mirror electron projection type or multi-beam scanning type inspection machine 1000 according to the present invention shown in FIG. 2B, will now be described in detail with reference to FIGS. 11A and 11B.

Figure 7:
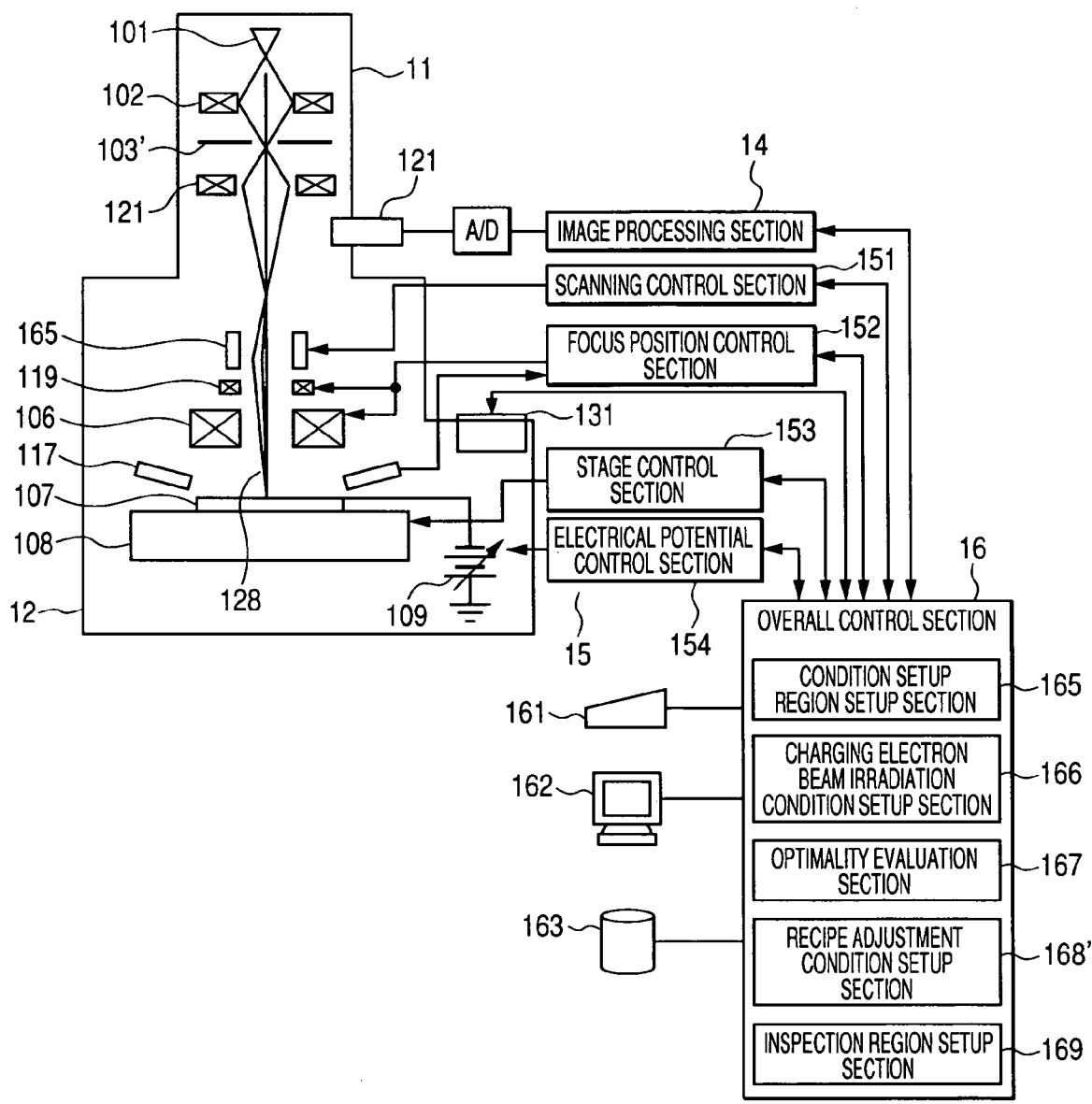
FIG. 7 illustrates a configuration of an SEM that doubles as an MSEM in accordance with a third embodiment of the present invention.
Figure 11A:
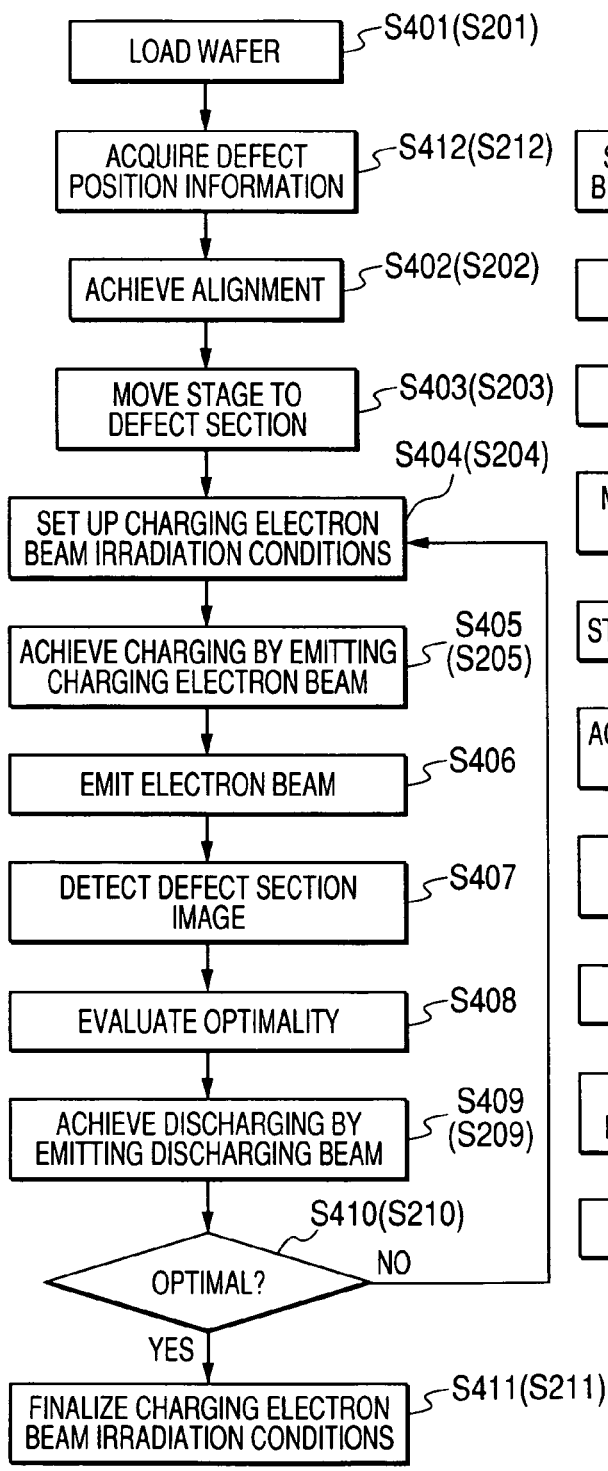
FIG. 11A is a flowchart illustrating a condition setup process performed by an MSEM in accordance with a seventh embodiment of the present invention.

As indicated in FIG. 11A, the condition setup process according to the seventh example differs from the condition setup process according to the fifth example in that the MSEM shown in FIG. 7 is used (the MSEM in the SEM is configured to adjust the electrical potential of an electrode on the condition setup specimen 107a so that incident beam electrons' kinetic energy prevailing directly above the specimen is approximately zero). Steps S401 to S405, steps S409 to S411, and step S412 are identical with steps S201 to S205, steps S209 to S211, and step S212. In step S406, an electron beam is shed on a defect. In step S407, the detector 121 detects a defect image and enters it into the image processing section 14. In step S408, the optimality evaluation section 167 evaluates the defect detection capability, that is, the optimality for detecting a defect, which is a density difference (difference image) that can be rendered obvious, in accordance with the defect image signal obtained from the image processing section 14, determines the optimum charge-up conditions (charging electron beam irradiation conditions), and supplies the determined conditions to the mirror electron projection type or multi-beam scanning type in-line inspection machine 1000 via the network 1030.

Figure 11B:
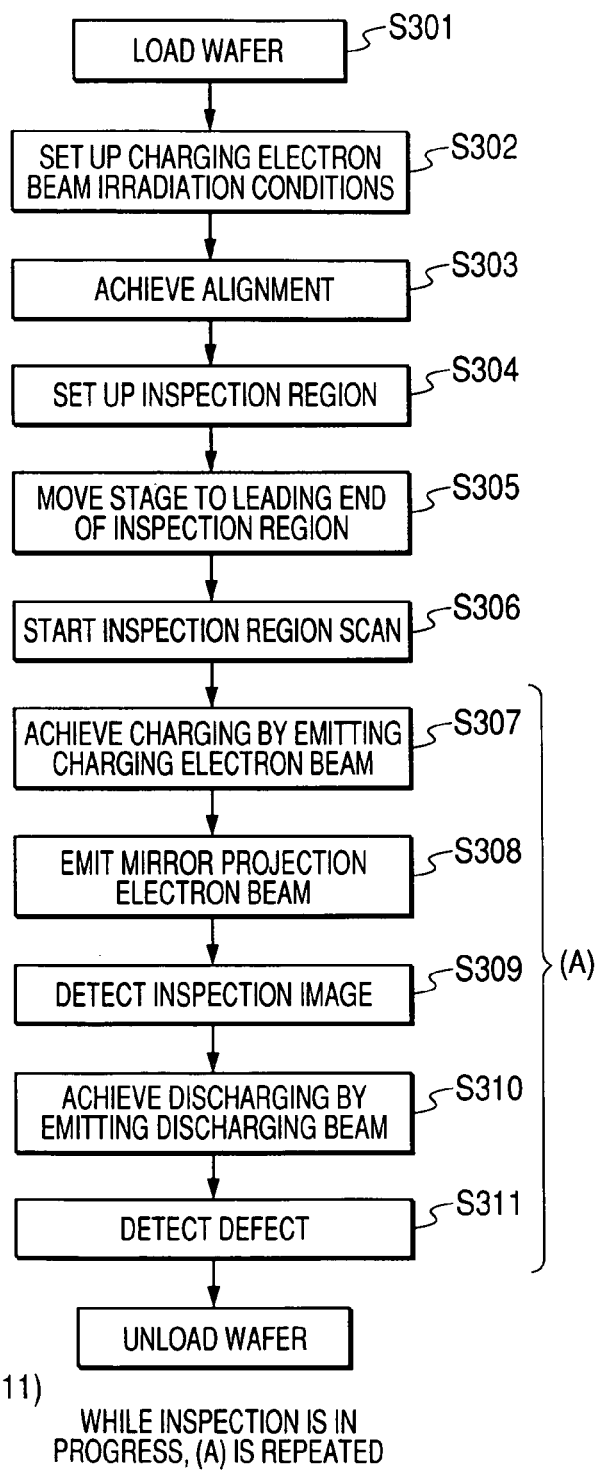
FIG. 11B is a flowchart illustrating a seventh embodiment of the present invention, which is a defect inspection process performed by a mirror electron projection type or multi-beam scanning type scanning electron beam apparatus.

The defect inspection process of the mirror electron projection type or multi-beam scanning type in-line inspection machine 1000, which is shown in FIG. 11B, is performed in the same manner as indicated in FIGS. 8B and 9B.

EIGHTH EXAMPLE

Figure 12:
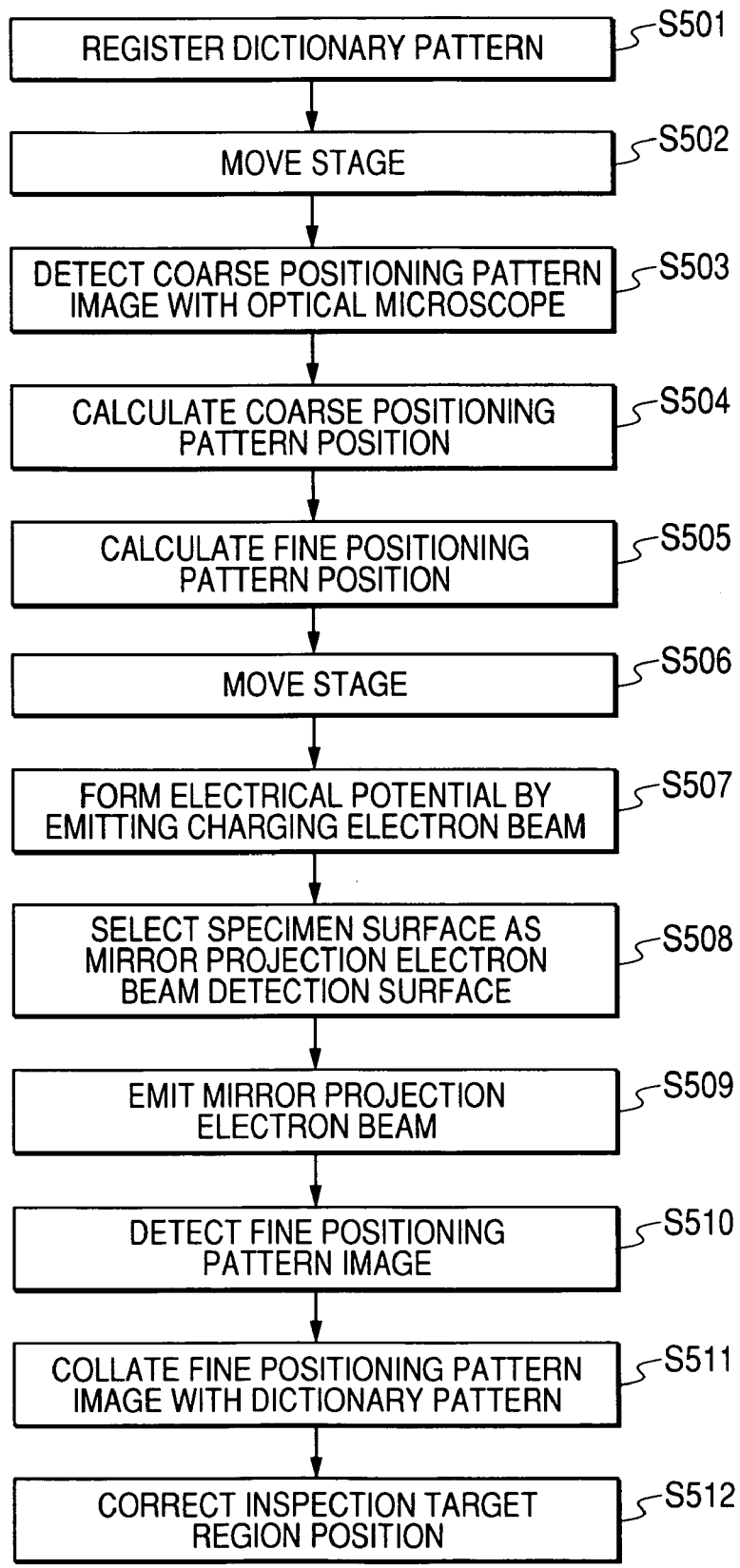
FIG. 12 is a flowchart illustrating an alignment operation performed by a mirror electron projection type or multi-beam scanning type scanning electron beam apparatus (particularly the MPJ type (SEPJ type included)) in accordance with an eighth embodiment of the present invention.

An eighth example of the present invention, which relates to an alignment process performed by a mirror electron projection type or multi-beam scanning type inspection machine (particularly an MPJ type (SEPJ type included) inspection machine), will now be described with reference to FIG. 12. The mirror image visual field is on the order of 0.1 mm, and the combination with low-magnification prealignment by an optical microscope is essential. Therefore, the specimen 107 is aligned in two steps: low-magnification prealignment by an optical microscope (not shown) and high-magnification alignment based on a mirror image. A mirror image is detected while it is in just focus (the surface of the specimen 107 is set at a focused focal point), and used to accurately set the positional relationship between a circuit pattern and detected image.

First of all, the alignment mark is placed in just focus (the specimen surface is set at a focused focal point) in the same manner as for condition setup while charging is achieved by the mirror electron projection type inspection machine 1010 or MSEM 1020, observed as a mirror image, and registered as a dictionary pattern having reference position coordinates (step S501). The stage 108 is then moved in the mirror electron projection type inspection machine 1000 (step S502). A coarse positioning pattern image is detected at low magnification by an optical microscope having a large visual field (step S503). The position of a coarse positioning pattern is then calculated to achieve coarse alignment (step S504) Next, the position of a fine positioning pattern is calculated from the coarse positioning pattern position that is calculated in accordance with the relationship between a known coarse positioning pattern and fine positioning pattern (step S505) The stage is then moved (step S506), and the charging device 1310 irradiates the fine positioning pattern with a charging electron beam to form an electrical potential (step S507). Next, the specimen surface is selected as the mirror electron projection electron beam detection surface so that the mirror electron projection electron beam detection surface is placed in just focus (step S508). The electron irradiation optics 11 then irradiates the fine positioning pattern with a mirror electron projection electron beam 310 (step S509), and the electron image formation optics 13 detects a fine positioning pattern image at high magnification while it is in just focus (step S510). Next, the detected, high-magnification, fine positioning pattern image is collated with the dictionary pattern having reference position coordinates (step S511), and fine alignment is achieved by correcting the position coordinate system of the inspection region for the reference position coordinate system possessed by the dictionary pattern (step S512). Fine alignment is now completed.

As shown in FIG. 5, a defect inspection is conducted in the corrected position coordinate system in accordance with a mirror image in a defocus position, which is offset from a just-focus position.

NINTH EXAMPLE

Figure 13:
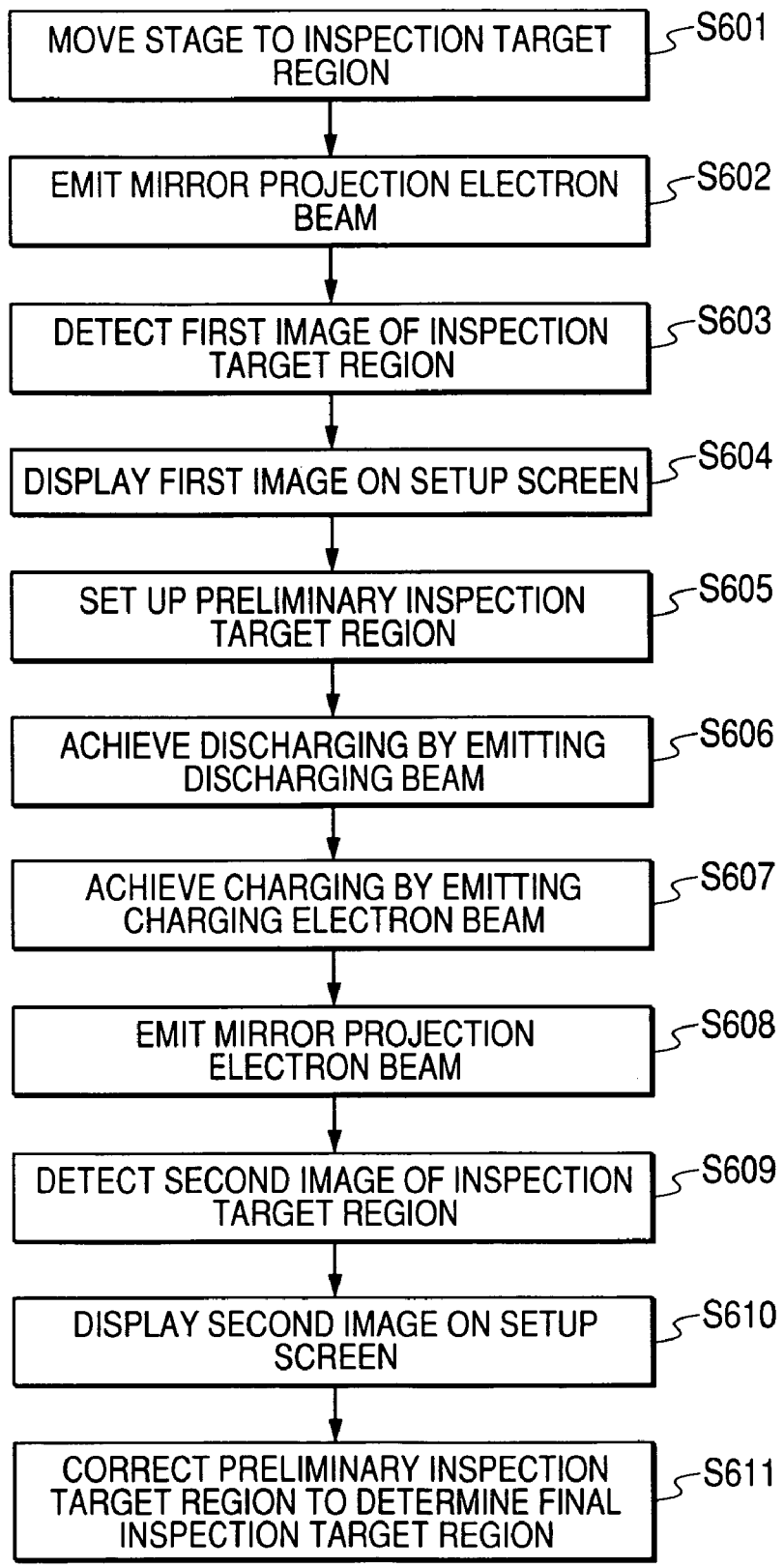
FIG. 13 is a flowchart illustrating an inspection region setup operation performed by an inspection region setup section of a mirror electron projection type or multi-beam scanning type scanning electron beam apparatus in accordance with a ninth embodiment of the present invention.
Figure 14B:
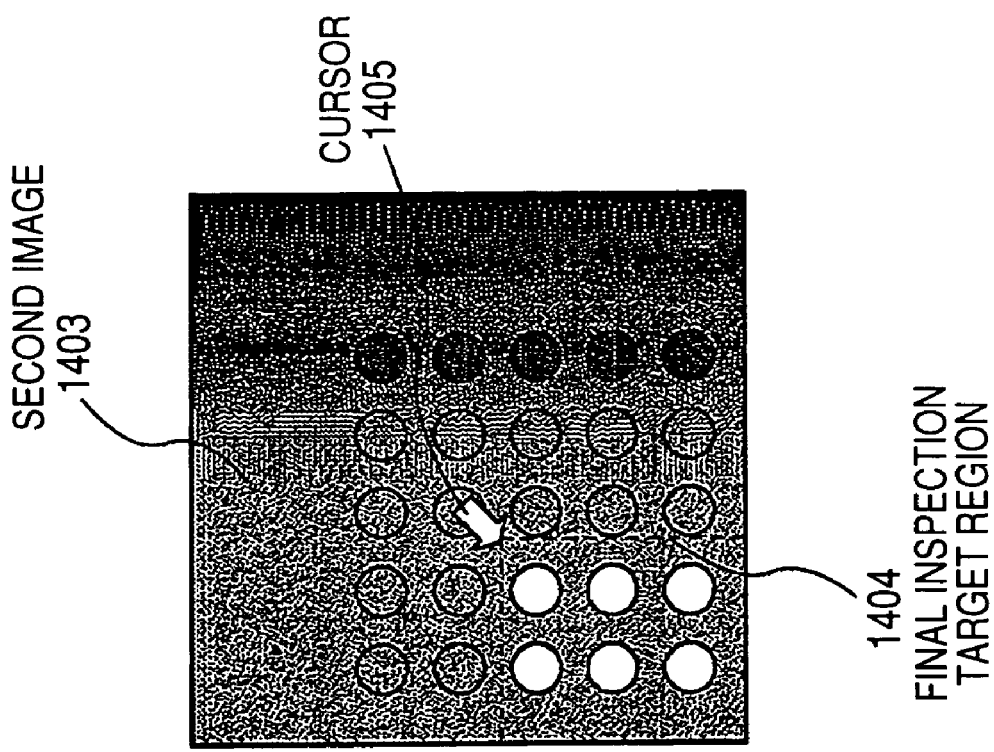
FIG. 14B illustrates a setup screen within a GUI screen that indicates a correction for a final inspection region based on a second image.
Figure 14A:
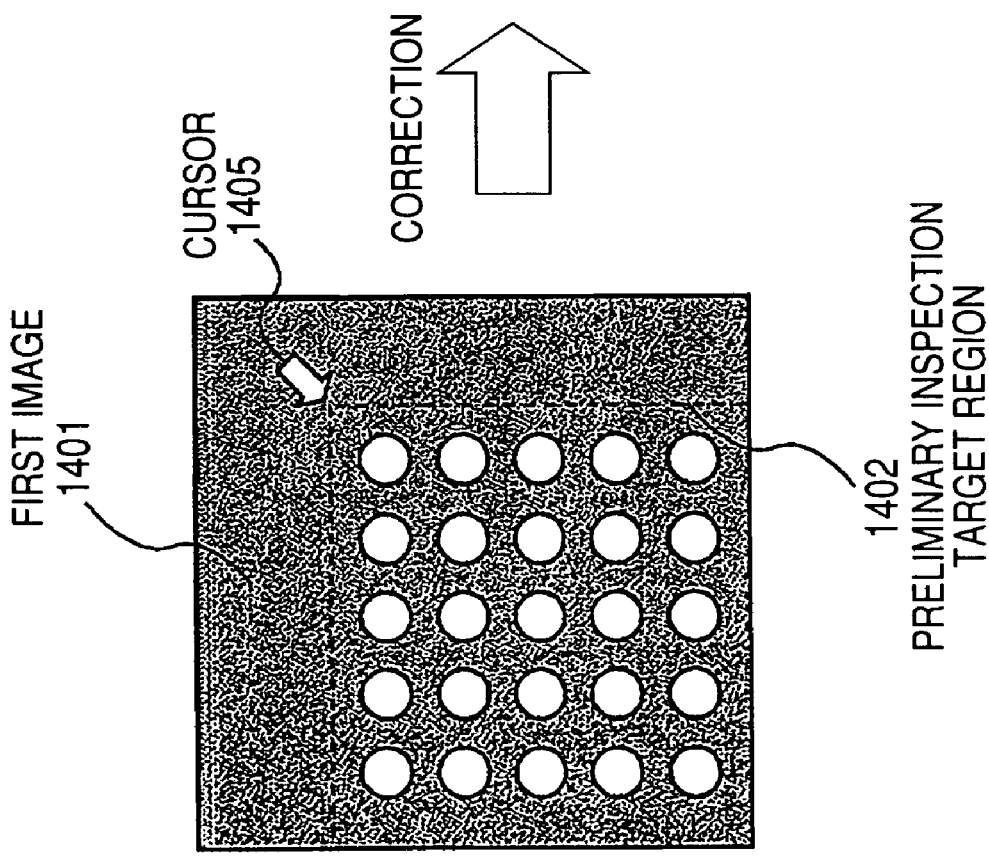
FIG. 14A illustrates a preliminary inspection region that is set in relation to a first image.

A ninth example of the present invention, which relates to an inspection region setup process performed by the inspection region setup section 169 of a mirror electron projection type or multi-beam scanning type inspection machine, will now be described with reference to FIGS. 13, 14A, and 14B.

As regards a mirror image, the detected light intensity is low at the end of a matte section within a chip (mirror electrons are obliquely reflected due to an inclined equipotential surface). Therefore, a preliminary inspection region is set up from a GUI screen by using an uncharged SEM image. In other words, when the mirror electron projection type inspection machine is used, the detected light intensity decreases at the end of the matte. Therefore, the width of a region in which the light intensity decreases is calculated at the time of inspection region setup, and a final inspection region is set by excluding the region where the light intensity decreases from the preliminary inspection region that is set, for instance, with an SEM image.

More specifically, the inspection region setup section 169 first issues an instruction to move the stage 108 to the inspection region for the semiconductor wafer 107 (step S601). Next, the inspection region setup section 169 issues an instruction to irradiate the inspection region with a mirror electron projection electron beam 310 (step S602), detects a first image 1401 of the inspection region (step S603), displays the detected first image 1401 on the GUI setup screen on the display 162 (step S604), and sets up the preliminary inspection region 1402 from the screen by using input means (cursor 1405) 161 as shown in FIG. 14A (step S605). The inspection region setup section 169 then issues an instruction to achieve discharging by causing the discharging device 1320 to emit a discharging beam (step S606), and charges the preliminary inspection region 1402 or inspection region by causing the charging device 1310 to emit a charging electron beam (step S607). Next, the inspection region setup section 169 issues an instruction to irradiate the preliminary inspection region 1402 or inspection region with a mirror electron projection electron beam 310 (step S608), detects a second image 1403 of the preliminary inspection region or inspection region (step S609), displays the detected second image 1403 on the GUI setup screen on the display 162 (step S610), and corrects the preliminary inspection region 1402 in the screen by using the input means (cursor 1405) 161 to determine and set up the final inspection region 1404 as shown in FIG. 14B (step S611). As described above, the inspection region setup section 169 can set up the final inspection region 1404 that makes it possible to conduct a defect inspection while a region where the detected light intensity is low is excluded from a mirror image on the semiconductor wafer.

TENTH EXAMPLE

Figure 15:
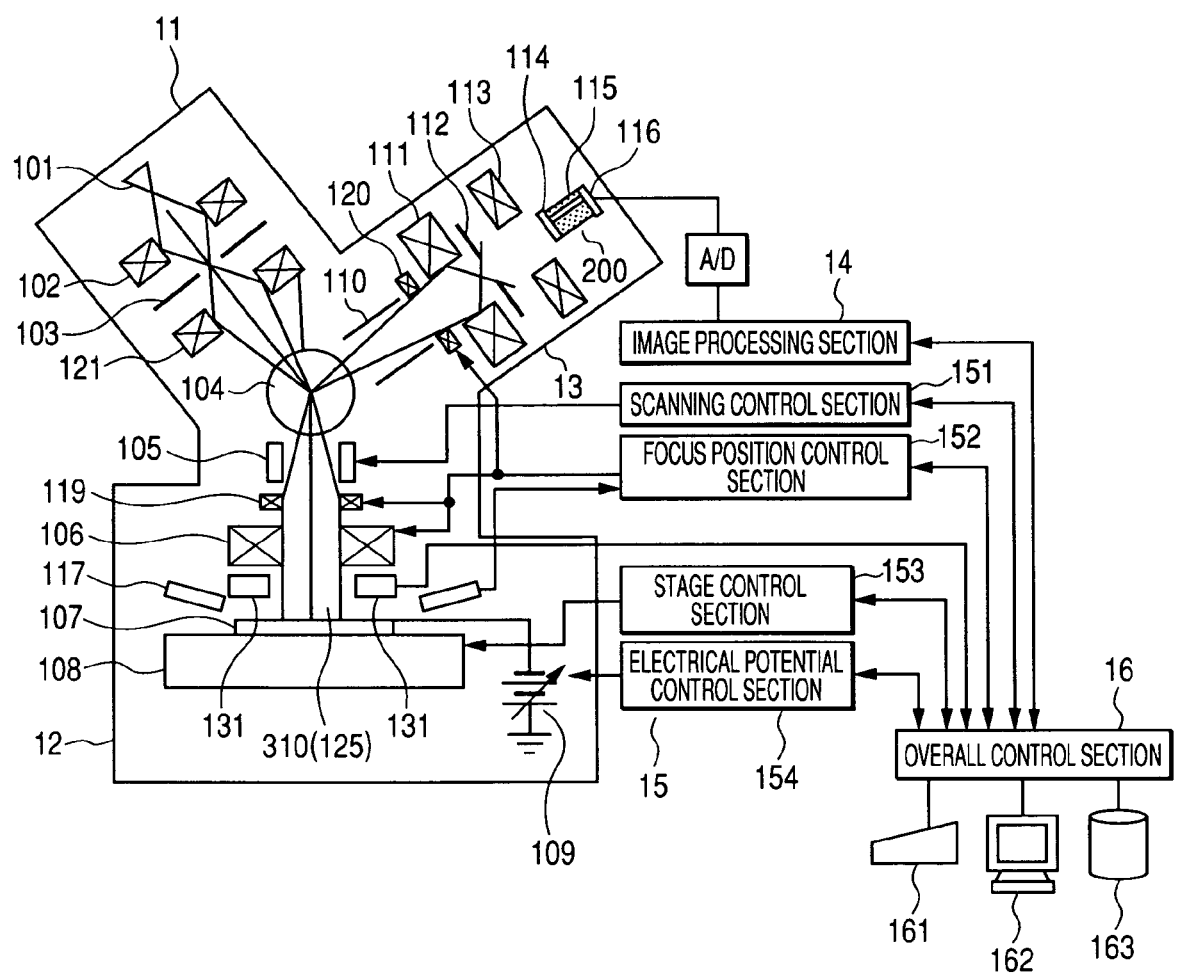
FIG. 15 illustrates a configuration of a mirror electron projection type or multi-beam scanning type scanning electron beam apparatus in accordance with a tenth embodiment of the present invention.
Figure 16A:
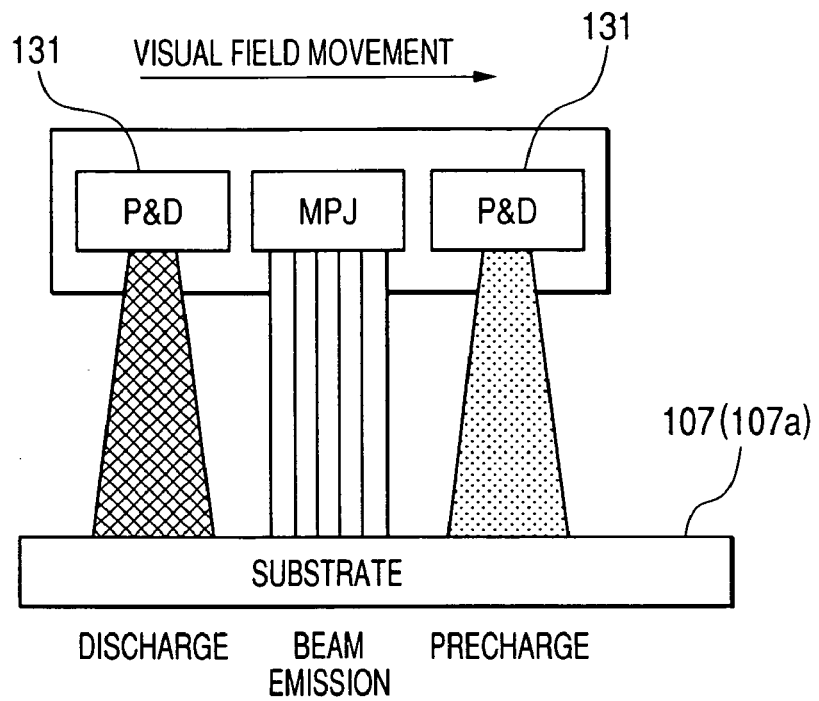
FIG. 16A illustrates a situation where a visual field moves rightward when a high-speed scan is performed of a stage to achieve precharging, mirror image detection, and discharging.
Figure 16B:
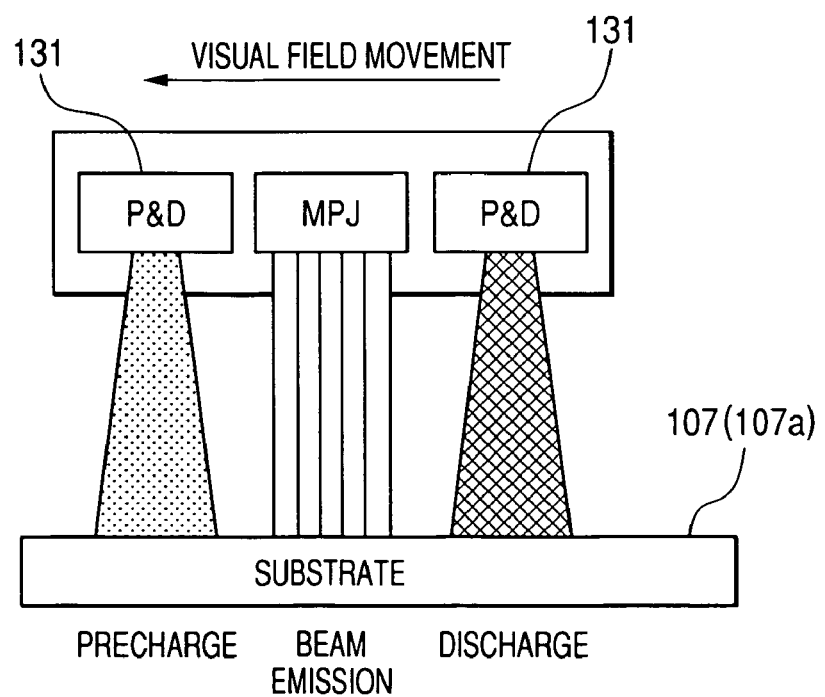
FIG. 16B illustrates a situation where the visual field moves leftward when a high-speed scan is performed of the stage to achieve precharging, mirror image detection, and discharging.

A tenth example of a mirror electron projection type or multi-beam scanning type inspection machine according to the present invention will now be described with reference to FIGS. 15, 16A, and 16B. FIG. 15 shows the tenth example of the mirror electron projection type inspection machines 1000, 1010. FIGS. 16A and 16B illustrate a precharge process, mirror image detection process, and discharge process that are performed by running a high-speed scan of the stage. The tenth example differs from the first example, which is shown in FIG. 3, and from the second example, which is shown in FIG. 6, in that the charging/discharging control device 131, which includes the charging device 1310 and discharging device 1320, is provided on both sides of the irradiation beams 310, 125 of the mirror electron projection type or multi-beam scanning type inspection machines 1000, 1010 to achieve charging, mirror image detection (observation), and discharging while a high-speed, unidirectional scan is performed of the stage 108. When the above configuration is employed, the inspection region can be subjected to charging by means of charging electron beam irradiation, mirror image detection by means of mirror electron projection or multiple electron beam irradiation, and discharging by means of discharging beam irradiation by moving the semiconductor wafer 107 (condition setup semiconductor wafer included) continuously at high speed in one direction as indicated in FIGS. 16A and 16B.

ELEVENTH EXAMPLE

Figure 17:
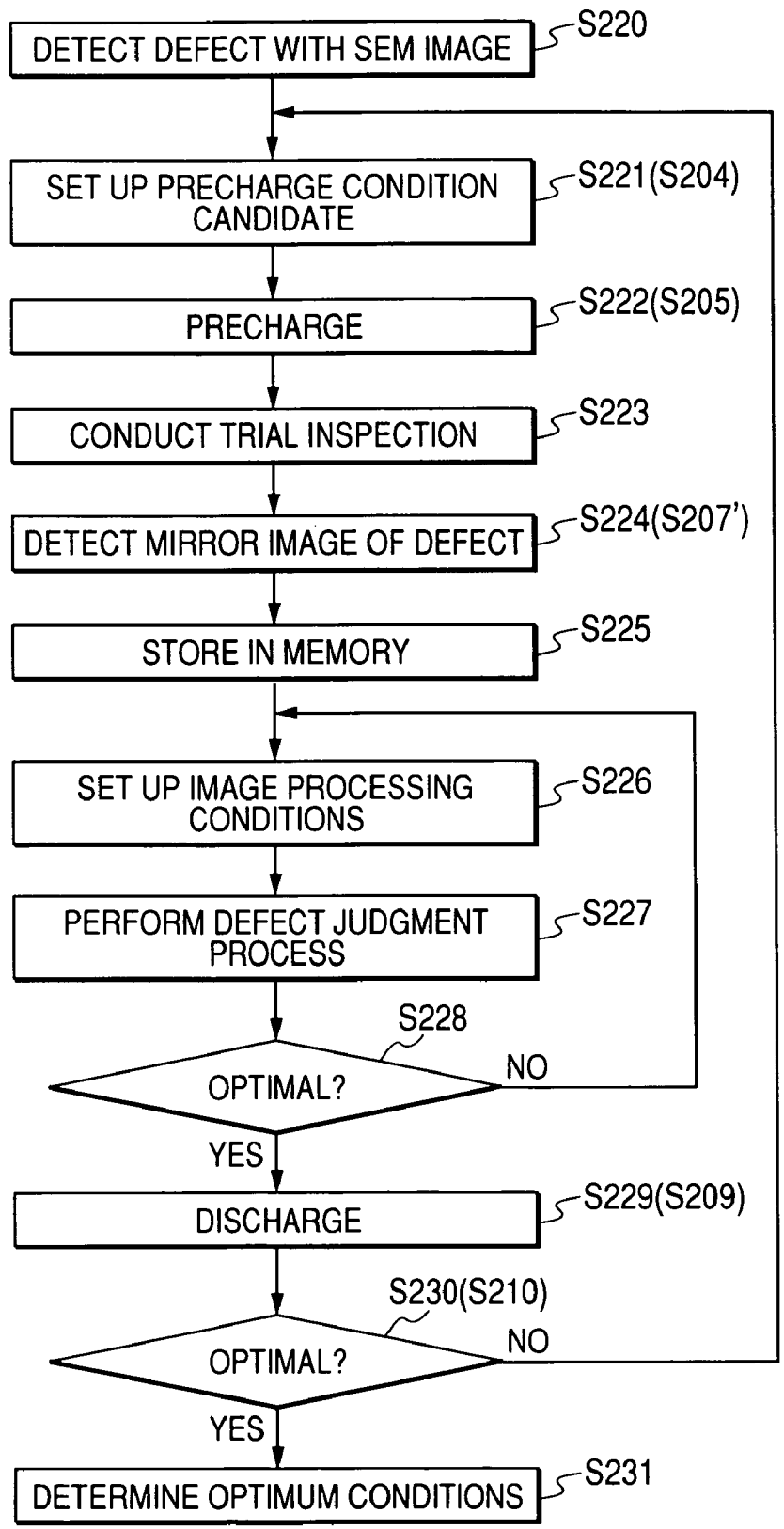
FIG. 17 is a flowchart illustrating an operation (stage scanning type) performed by a mirror electron projection type or multi-beam scanning type scanning electron beam apparatus for condition setup in accordance with an eleventh embodiment of the present invention.

An eleventh example of the present invention, which relates to a stage scanning type operation that is performed by a mirror electron projection type or multi-beam scanning type inspection machine for condition setup, will now be described with reference to FIG. 17. A condition setup wafer 107a having defects is loaded into the mirror electron projection type or multi-beam scanning type inspection machine for condition setup 1010. While the stage 108 is moved, an SEM image is detected by emitting a mirror electron projection or multiple electron beam in a situation where charging is not achieved, and a plurality of defects are detected in accordance with the detected SEM image (step S220). The process for defect detection based on the SEM image may be performed in advance by using the SEM 1020. Preparations are now completed.

Next, the setup section 166 sets a precharge condition candidate (step S221 (S204)). While the stage 108 is continuously moved, the charging device 1310 emits a charging electron beam to achieve precharging in accordance with the set precharge condition candidate (step S222 (S205)). A trial inspection is then conducted by irradiating many defects that subsequently appear with a mirror electron projection or multiple electron beam (step S223). Mirror images of many defects are detected (step S224 (step S207)). The detected mirror images are then stored in the image memories 143, 144 (step S225). Next, the recipe adjustment condition setup section 168 sets image processing conditions (e.g., defect judgment threshold value) (step S226). In accordance with the set image processing conditions, the defect judgment section 145 performs a defect judgment process (step S227). The defect judgment process is repeatedly performed with the image processing conditions changed. In step S228, the optimum set of image processing conditions is selected and stored in the storage device 163. Next, a discharging process is performed (step S228), and steps S221 to S229 are repeated. When the optimum result is obtained in step S230 (S210), the optimum precharge conditions for many defects and the prevailing optimum image processing conditions are determined (step S231), and can be supplied to the mirror electron projection type or multi-beam scanning type inspection machine 1000. Since the defects can be classified into a plurality of types in accordance with an SEM image, the optimum precharge conditions and image processing conditions can be determined for each type. At the same time, the optimum mirror image detection conditions can also be determined.

TWELFTH EXAMPLE

Figure 18:
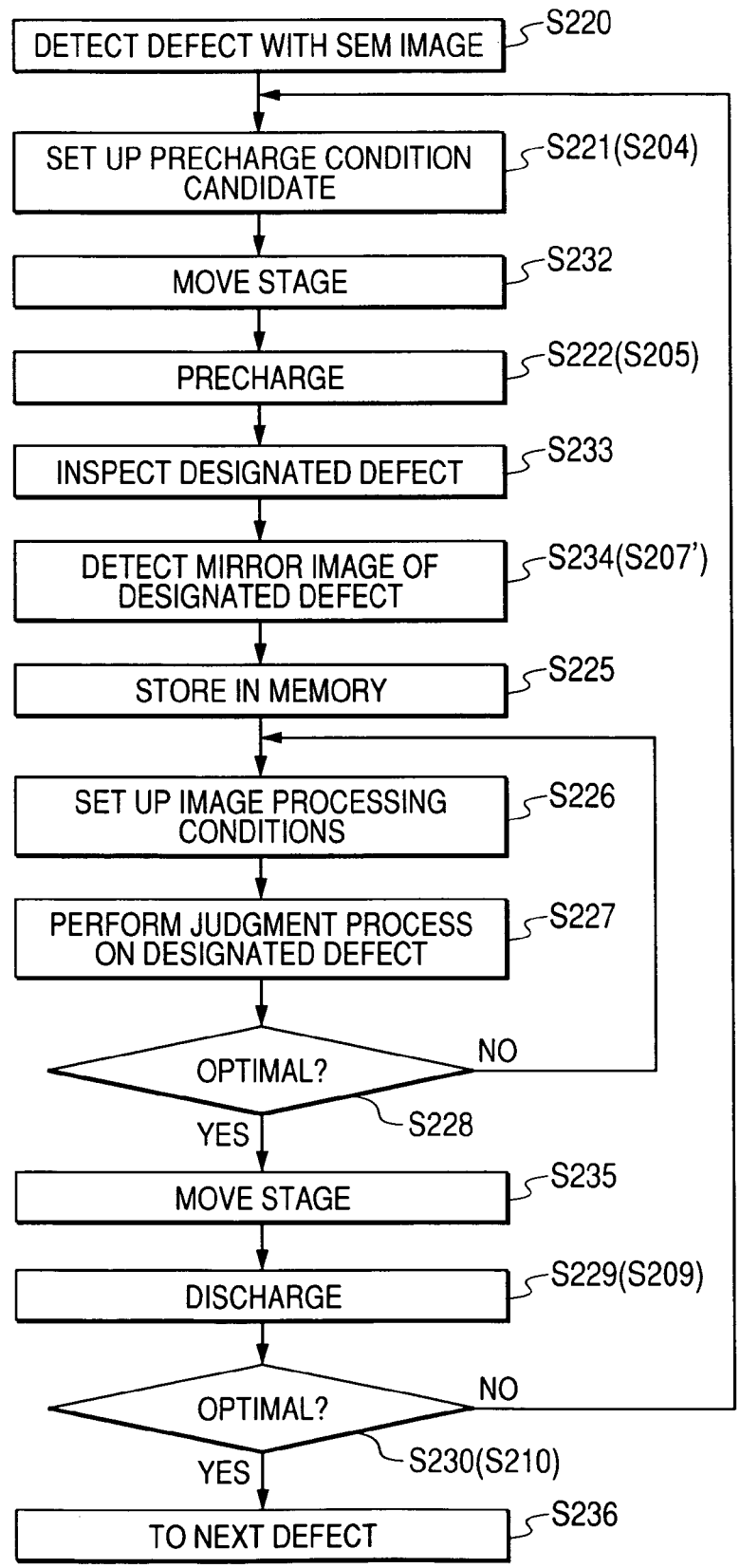
FIG. 18 is a flowchart illustrating an operation (step-and-repeat type) performed by a mirror electron projection type or multi-beam scanning type scanning electron beam apparatus for condition setup in accordance with a twelfth embodiment of the present invention.

A twelfth example of the present invention, which relates to a step-and-repeat type operation that is performed by a mirror electron projection type or multi-beam scanning type inspection machine for condition setup, will now be described with reference to FIG. 18. The twelfth example differs from the eleventh example in steps S232, S233, S234 (S207'), S235, and S236. More specifically, stage transport steps S232 and S234 are added to perform a step-and-repeat operation for the stage 108. For defect designation, step S233 is performed to inspect a designated defect. Step S234 (S207') is performed to detect a mirror image with a defect designated. Step S236 is followed to proceed to the next defect.

The twelfth example provides the same advantages as the eleventh example.

The present invention can be applied to a mirror electron projection type or multi-beam scanning type scanning electron beam apparatus.

The present invention may be embodied in other specific forms without departing from the spirit or essential characteristics thereof. The embodiments described above are therefore to be considered in all respects as illustrative and not restrictive. The scope of the invention indicated by the appended claims rather than by the foregoing description and all changes that come within the meaning and range of equivalency of the claims are therefore intended to be embraced therein.

What is claimed is:

1. A method for inspecting pattern defects with a scanning electron beam apparatus, the method comprising:
a condition setup step of determining precharge conditions, which are charging electron beam irradiation conditions for charging a specimen with a condition setup scanning electron beam apparatus; and
a defect inspection step of charging an inspection region on an inspection specimen by irradiating the inspection specimen with a charging electron beam by using an inspection scanning electron beam apparatus under the precharge conditions determined in the condition setup step, irradiating the charged inspection region with an electron beam, causing a detector to detect secondary electrons or reflected electrons that are generated from a surface and proximity of the specimen due to electron beam irradiation, and detecting a defect by processing a signal derived from electron detection;
wherein determining the precharge conditions in the condition setup step further includes the steps of:
irradiating a desired region on the specimen with a charging electron beam to charge the desired region and form an electrical potential distribution near the desired region;
irradiating the desired region, for which the electrical potential distribution is formed, with a condition setup electron beam and allowing a detector to detect secondary electrons or reflected electrons generated from the surface and proximity of the specimen;
discharging the desired region on which the condition setup electron beam is shed;
repeating the steps between the electrical potential distribution formation step and the discharging step a number of times while varying the charging electron beam irradiation conditions; and determining the precharge conditions in accordance with a signal that is derived from the detection of the secondary electrons or reflected electrons in the detection step during the repetition of the steps.

2. The method according to claim 1, wherein the step of allowing the detector to detect the secondary electrons or reflected electrons in the condition setup step is followed to let a mirror electron projection type scanning electron beam apparatus irradiate the desired region on the specimen, for which the electrical potential distribution is formed, with a planar electron beam to achieve mirror electron projection and allow the detector to detect mirror electrons that are generated due to the mirror electron projection.

3. The method according to claim 1, wherein the scanning electron beam apparatus for inspection is a mirror electron projection type scanning electron beam apparatus.

4. The method according to claim 3, wherein the step of allowing the detector to detect the secondary electrons or reflected electrons in the defect inspection step is followed to let a mirror electron projection type scanning electron beam apparatus irradiate the charged inspection region on the specimen with a planar electron beam and allow the detector to detect mirror electrons that are generated due to mirror electron projection, which is caused by planar electron beam irradiation.

5. The method according to claim 1, wherein the step of allowing the detector to detect the secondary electrons or reflected electrons in the condition setup step is followed to let a multi-beam scanning type scanning electron beam apparatus irradiate the desired region on the specimen, for which the electrical potential distribution is formed, with a multiple beam to achieve mirror electron projection and allow the detector to detect secondary electrons or reflected electrons that are generated due to the mirror electron projection.

6. The method according to claim 1, wherein the scanning electron beam apparatus for inspection is a multi-beam scanning type scanning electron beam apparatus.

7. The method according to claim 6, wherein the step of allowing the detector to detect the secondary electrons or reflected electrons in the defect inspection step is followed to let a multi-beam scanning type scanning electron beam apparatus irradiate the charged inspection region on the specimen with a multiple electron beam to achieve mirror electron projection and allow the detector to detect secondary electrons or reflected electrons that are generated due to the mirror electron projection.

8. The method according to claim 1, wherein the defect inspection step is followed to irradiate the inspection region on the specimen with an electron beam to generate secondary electrons or reflected electrons on a surface or proximity of the specimen, allow the detector to detect the generated secondary electrons or reflected electrons, and discharge the inspection region.

9. The method according to claim 8, wherein the inspection region on the specimen, for which the electrical potential distribution is formed, is discharged by irradiating the inspection region with an ion shower or electron shower.

10. The method according to claim 8, wherein the inspection region on the specimen, for which the electrical potential distribution is formed, is discharged by bringing an electrode into contact with the inspection region.

11. The method according to claim 1, wherein the scanning electron beam apparatus used in the defect inspection step includes a plurality of scanning electron beam apparatuses incorporated into a semiconductor manufacture line; and wherein at least the precharge conditions, which are determined in the condition setup step, are supplied to the plurality of scanning electron beam apparatuses.

12. An apparatus for inspecting pattern defects, the apparatus comprising:
a stage for supporting and transporting the specimen;
charging condition setup means for setting charging conditions for an inspection region on the specimen for defect inspection purposes;
charging means for charging a circuit-pattern-containing inspection region on the specimen mounted on the stage by irradiating the inspection region with a charging electron beam under the charging conditions set by the charging condition setup means and generating an electrical potential distribution near the inspection region;
electron beam irradiation means for irradiating the inspection region, near which the electrical potential distribution is formed by the charging means, with a planar electron beam or a multiple electron beam;
detection means for detecting secondary electrons or reflected electrons generated from the surface and proximity of the specimen that is irradiated with a planar electron beam or a multiple electron beam by the electron beam irradiation means; and
defect detection means for detecting a defect by processing an image signal detected by the detection means;
wherein the charging condition setup means charges a desired region on the specimen by allowing the charging means to irradiate the desired region with a charging electron beam, forms an electrical potential distribution near the desired region, irradiates the desired region with an electron beam, allows a detector to detect secondary electrons or reflected electrons generated from a surface and proximity of the specimen, and optimizes charging electron beam irradiation conditions for defect inspection in accordance with an image that is derived from the electron detection.

13. The apparatus according to claim 12, wherein the electron beam irradiation means sheds a planar electron beam onto the desired region on the specimen for which an electrical potential distribution is formed; and wherein the detection means allows the detector to detect mirror electrons that are generated due to the irradiation of the planar electron beam.

14. The apparatus according to claim 12, wherein the electron beam irradiation means sheds a multiple electron beam onto the desired region on the specimen for which an electrical potential distribution is formed; and wherein the detection means allows the detector to detect secondary electrons or reflected electrons that are generated due to the irradiation of the multiple electron beam.

15. The apparatus according to claim 12, further comprising:
an optical microscope for detecting a positioning pattern image formed on the specimen at low magnification.

16. The apparatus according to claim 12, further comprising:
discharging means for discharging the inspection region of the specimen,
wherein the discharging means discharges a region opposite the region to be charged by the charging means in a situation where the electron beam irradiation means above the specimen irradiates the inspection region with the planar electron beam or the multiple electron beam.

17. The apparatus according to claim 16, wherein the charging means emits a charging electron beam to charge the leading side of the inspection region of the specimen mounted on the stage; and wherein the discharging means discharges the trailing side of the inspection region of the specimen mounted on the stage.

18. The apparatus according to claim 16, wherein the discharging means emits an ion shower or an electron shower to discharge the inspection region on the specimen for which an electrical potential distribution is formed.

19. The apparatus according to claim 16, wherein the discharging means discharges the inspection region on the specimen, for which an electrical potential distribution is formed, by bringing an electrode into contact with the inspection region.

* * * * *